(12) United States Patent
Kim et al.

(10) Patent No.: US 12,731,647 B2
(45) Date of Patent: Sep. 8, 2026

(54) ELECTRONIC DEVICE FOR MANUFACTURING OF SEMICONDUCTOR DEVICE AND OPERATING METHOD OF ELECTRONIC DEVICE

(71) Applicant: Samsung Electronics Co., Ltd., Suwon-si (KR)

(72) Inventors: TaeHyun Kim, Suwon-si (KR); Hyunjoong Kim, Suwon-si (KR); Jichull Jeong, Suwon-si (KR); Euihyun Cheon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 124 days.

(21) Appl. No.: 18/402,356

(22) Filed: Jan. 2, 2024

(65) Prior Publication Data

US 2024/0371445 A1 Nov. 7, 2024

(30) Foreign Application Priority Data

May 2, 2023 (KR) ........................ 10-2023-0057219

(51) Int. Cl.
*G11C 16/26* (2006.01)
*G11C 5/06* (2006.01)
*G11C 16/04* (2006.01)

(52) U.S. Cl.
CPC .............. *G11C 16/26* (2013.01); *G11C 5/063* (2013.01); *G11C 16/0483* (2013.01)

(58) Field of Classification Search
CPC ............................ G11C 16/0483; G11C 16/26
See application file for complete search history.

(56) References Cited

U.S. PATENT DOCUMENTS 7,679,133 B2 3/2010 Son et al.
8,161,430 B2 * 4/2012 Jung ..................... G06F 30/373 716/100
8,553,466 B2 10/2013 Han et al.
8,559,235 B2 10/2013 Yoon et al.
8,654,587 B2 2/2014 Yoon et al.
(Continued)

FOREIGN PATENT DOCUMENTS

JP 6995451 B2 1/2022

*Primary Examiner* — Amir Zarabian
*Assistant Examiner* — Anthony Thinh Tang
(74) *Attorney, Agent, or Firm* — Muir Patent Law, PLLC

(57) ABSTRACT

An operating method of a circuit design system which includes a processor and a memory includes reading, at the processor, a circuit layout of a flash memory device including a page buffer from the memory, initializing, at the processor, a value of a first parameter of at least one transistor of the page buffer and a value of a second parameter of at least one voltage applied to the page buffer, performing, at the processor, circuit simulation on the page buffer using the initialized first and second parameters, and calculating, at the processor, a reward based on a result of the circuit simulation. The processor is configured to perform, in response to the reward being not greater than a threshold value, a subsequent action. The subsequent action includes adjust the value of the first parameter of the at least one transistor and the value of the second parameter of the at least one voltage, and perform subsequent circuit simulation on the page buffer using the adjusted first and second parameters.

20 Claims, 12 Drawing Sheets

(56) References Cited

U.S. PATENT DOCUMENTS

| | | | | |
|---|---|---|---|---|
| 9,792,397 | B1 | 10/2017 | Nagaraja | |
| 10,755,026 | B1 | 8/2020 | Luo | |
| 11,222,237 | B2 | 1/2022 | Taniai | |
| 11,281,832 | B2 | 3/2022 | Huh et al. | |
| 2011/0233648 | A1 | 9/2011 | Seol et al. | |
| 2020/0184137 | A1* | 6/2020 | Tsutsui ..................... | G06N 3/08 |
| 2021/0133376 | A1 | 5/2021 | Wang et al. | |
| 2021/0342516 | A1 | 11/2021 | Ren et al. | |
| 2022/0083720 | A1 | 3/2022 | Chouba et al. | |
| 2023/0154505 | A1* | 5/2023 | Chun ....................... | G11C 7/20<br>365/185.25 |

* cited by examiner

FIG. 3

ELECTRONIC DEVICE FOR MANUFACTURING OF SEMICONDUCTOR DEVICE AND OPERATING METHOD OF ELECTRONIC DEVICE

CROSS-REFERENCE TO RELATED APPLICATIONS

This application claims priority under 35 U.S.C. § 119 to Korean Patent Application No. 10-2023-0057219 filed on May 2, 2023, in the Korean Intellectual Property Office, the disclosures of which are incorporated by reference herein in their entireties.

BACKGROUND

Embodiments of the present disclosure described herein relate to an electronic device, and more particularly, relate to an electronic device supporting the manufacturing of a semiconductor device and an operating method of the electronic device.

A storage device refers to a device, which stores data under control of a host device, such as a computer, a smartphone, and a smart pad. The storage device includes a device, which stores data on a magnetic disk, such as a hard disk drive (HDD), or a device, which stores data in a semiconductor memory, in particular, a nonvolatile memory, such as a solid state drive (SSD) and a memory card.

The nonvolatile memory includes a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), etc.

The flash memory may include a memory cell array corresponding to a core, and peripheral circuits for controlling memory cells of the memory cell array. With the development of semiconductor manufacturing technologies, the memory cells of the flash memory and the transistors of the peripheral circuits of the flash memory are being miniaturized. The miniaturized memory cells and the miniaturized transistors may be more strongly affected by noise.

SUMMARY

Embodiments of the present disclosure provide an electronic device supporting the manufacturing of a flash memory with an operating characteristic more robust against noise and an operating method of the electronic device.

According to an aspect of the present disclosure, an operating method of a circuit design system which includes a processor and a memory includes reading, at the processor, a circuit layout of a flash memory device including a page buffer from the memory, initializing, at the processor, a value of a first parameter of at least one transistor of the page buffer and a value of a second parameter of at least one voltage applied to the page buffer, performing, at the processor, circuit simulation on the page buffer using the initialized first and second parameters, and calculating, at the processor, a reward based on a result of the circuit simulation. The processor is configured to perform, in response to the reward being not greater than a threshold value, a subsequent action. The subsequent action includes adjust the value of the first parameter of the at least one transistor and the value of the second parameter of the at least one voltage, and perform subsequent circuit simulation on the page buffer using the adjusted first and second parameters.

According to an aspect of the present disclosure, an operating method of a circuit design system which includes a processor and a memory includes reading, at the processor, a circuit layout of a flash memory device including a page buffer from the memory and performing, at the processor, a plurality of episodes on the circuit layout based on a policy. Each of the plurality of episodes includes performing, at the processor, circuit simulation on the layout circuit based on a value of a first parameter of at least one transistor of the page buffer and a value of a second parameter of at least one voltage applied to the page buffer, calculating, at the processor, a reward based on reward parameters calculated based on a result of the circuit simulation, and performing a subsequent action on the layout circuit until a reward of the subsequent action is greater than a threshold value. The subsequent action includes adjusting the value of the first parameter and the value of the second parameter, performing subsequent circuit simulation on the page buffer using the adjusted first and second parameters, and calculating the reward based on a result of the subsequent circuit simulation.

According to an aspect of the present disclosure, a circuit design system includes a memory configured to store a circuit layout of a flash memory device including a page buffer, and a processor configured to read the circuit layout from the memory, and perform a plurality of episodes on the circuit layout based on a policy. The policy is updated in each episode of the plurality of episode. In each of the plurality of episodes, the processor is configured to perform circuit simulation on the page buffer based on a first parameter of at least one transistor of the page buffer and a second parameter of at least one voltage applied to the page buffer, calculate a reward based on reward parameters calculated through the circuit simulation, adjust values of the first and second parameters; and repeat the circuit simulation, the adjustment of the first and second parameters, and the calculation of the reward, until the reward is greater than a threshold value.

BRIEF DESCRIPTION OF THE FIGURES

The above and other objects and features of the present disclosure will become apparent by describing in detail embodiments thereof with reference to the accompanying drawings.

FIG. 3 illustrates an example of components of a memory cell array corresponding to one bit line and components of a page buffer block corresponding to one bit line.

DETAILED DESCRIPTION

Below, embodiments of the present disclosure will be described in detail and clearly to such an extent that an ordinary one in the art easily carries out the present disclosure.

Figure 1:
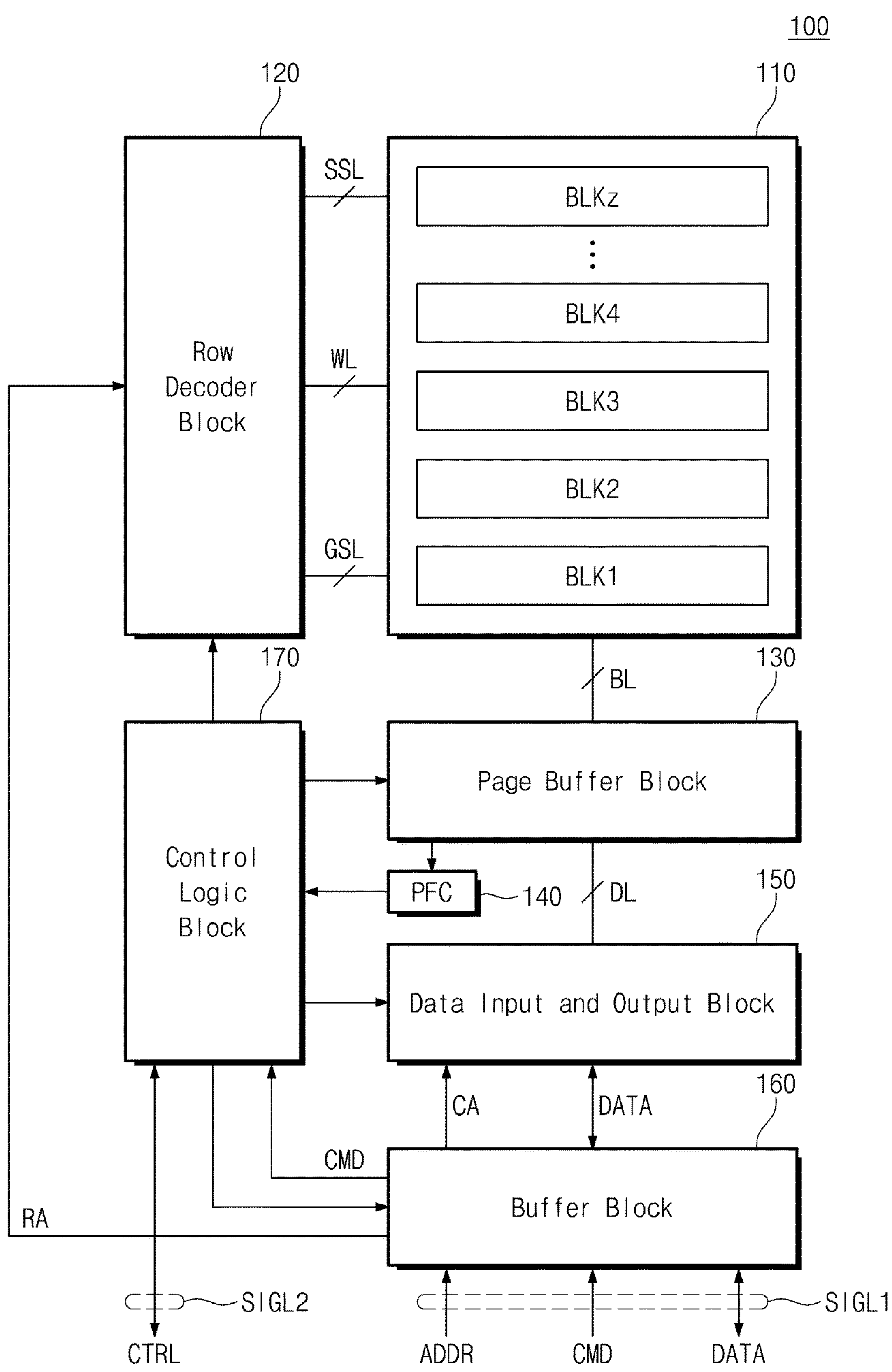
FIG. 1 is a block diagram illustrating a nonvolatile memory device according to an embodiment of the present disclosure.

FIG. 1 is a block diagram illustrating a nonvolatile memory device 100 according to an embodiment of the present disclosure. In an embodiment, the nonvolatile memory device 100 may be implemented with a flash memory device, but embodiments of the present disclosure are not limited to the flash memory device.

Referring to FIG. 1, the nonvolatile memory device 100 includes a memory cell array 110, a row decoder block 120, a page buffer block 130, a pass/fail check block (PFC) 140, a data input and output block 150, a buffer block 160, and a control logic block 170.

The memory cell array 110 includes a plurality of memory blocks BLK1 to BLKz. Each of the memory blocks BLK1 to BLKz includes a plurality of memory cells. Each of the memory blocks BLK1 to BLKz may be connected to the row decoder block 120 through at least one ground selection line GSL, word lines WL, and at least one string selection line SSL. Some of the word lines WL may be used as dummy word lines. Each of the memory blocks BLK1 to BLKz may be connected to the page buffer block 130 through a plurality of bit lines BL. The plurality of memory blocks BLK1 to BLKz may be connected in common to the plurality of bit lines BL.

In an embodiment, each of the plurality of memory blocks BLK1 to BLKz may correspond to a unit of a erase operation. Memory cells belonging to each memory block may be erased at the same time. In an embodiment, each of the memory blocks BLK1 to BLKz may be divided into a plurality of sub-blocks. Each of the plurality of sub-blocks may correspond to a unit of the erase operation.

The row decoder block 120 is connected to the memory cell array 110 through the at least one ground selection line GSL, the word lines WL, and the at least one string selection line SSL. The row decoder block 120 operates under control of the control logic block 170.

The row decoder block 120 may decode a row address RA received from the buffer block 160 and may control voltages to be applied to the string selection lines SSL, the word lines WL, and the ground selection lines GSL based on the decoded row address.

The page buffer block 130 is connected to the memory cell array 110 through the plurality of bit lines BL. The page buffer block 130 is connected to the data input and output block 150 through a plurality of data lines DL. The page buffer block 130 operates under control of the control logic block 170.

In a program operation, the page buffer block 130 may store data to be written in memory cells. The page buffer block 130 may apply voltages to the plurality of bit lines BL based on the stored data. In a read operation or in a verify read operation that is performed in the program operation or the erase operation, the page buffer block 130 may sense voltages of the bit lines BL and may store a sensing result.

In the verify read operation associated with the program operation or the erase operation, the pass/fail check block 140 may verify the sensing result of the page buffer block 130. For example, in the verify read operation that is performed in the program operation, the pass/fail check block 140 may count the number of values (e.g., the number of 0s) corresponding to on-cells that are not programmed to a target threshold voltage or higher.

In the verify read operation that is performed in the erase operation, the pass/fail check block 140 may count the number of values (e.g., the number of Is) corresponding to off-cells that are not erased to a target threshold voltage or lower. When the counting result is greater than or equal to a threshold value, the pass/fail check block 140 may output a fail signal to the control logic block 170. When the counting result is smaller than the threshold value, the pass/fail check block 140 may output a pass signal to the control logic block 170. Depending on the verification result of the pass/fail check block 140, a program loop of the program operation may be further performed, or an erase loop of the erase operation may be further performed.

The data input and output block 150 is connected to the page buffer block 130 through the plurality of data lines DL. The data input and output block 150 may receive a column address CA from the buffer block 160. The data input and output block 150 may output the data read by the page buffer block 130 to the buffer block 160 depending on the column address CA. The data input and output block 150 may provide the data received from the buffer block 160 to the page buffer block 130, based on the column address CA.

Through first signal lines SIGL1, the buffer block 160 may receive a command CMD and an address ADDR from an external device and may exchange data "DATA" with the external device. The buffer block 160 may operate under control of the control logic block 170. The buffer block 160 may provide the command CMD to the control logic block 170. The buffer block 160 may provide the row address RA of the address ADDR to the row decoder block 120 and may provide the column address CA of the address ADDR to the data input and output block 150. The buffer block 160 may exchange the data "DATA" with the data input and output block 150.

The control logic block 170 may exchange a control signal CTRL with the external device through second signal lines SIGL2. The control logic block 170 may allow the buffer block 160 to route the command CMD, the address ADDR, and the data "DATA" to corresponding functional blocks in the nonvolatile memory device 100. The control logic block 170 may decode the command CMD received from the buffer block 160 and may control the nonvolatile memory device 100 based on the decoded command.

In an embodiment, the nonvolatile memory device 100 may be manufactured in a bonding method. The memory cell array 110 may be manufactured by using a first wafer, and the row decoder block 120, the page buffer block 130, the pass/fail check block 140, the data input and output block 150, the buffer block 160, and the control logic block 170 may be manufactured by using a second wafer. The nonvolatile memory device 100 may be implemented by coupling the first wafer to the second wafer such that an upper surface of the first wafer and an upper surface of the second wafer face each other.

In an embodiment, the nonvolatile memory device 100 may be manufactured in a cell over peripheral (COP) structure. A peripheral circuit including the row decoder block 120, the page buffer block 130, the pass/fail check block 140, the data input and output block 150, the buffer block 160, and the control logic block 170 may be implemented on a substrate. The memory cell array 110 may be implemented over the peripheral circuit. The peripheral circuit and the memory cell array 110 may be connected by using through vias. For example, the nonvolatile memory device 100 may include the memory cell array 110 and the peripheral circuit which are vertically stacked and electrically connected with each other using vias.

Figure 2:
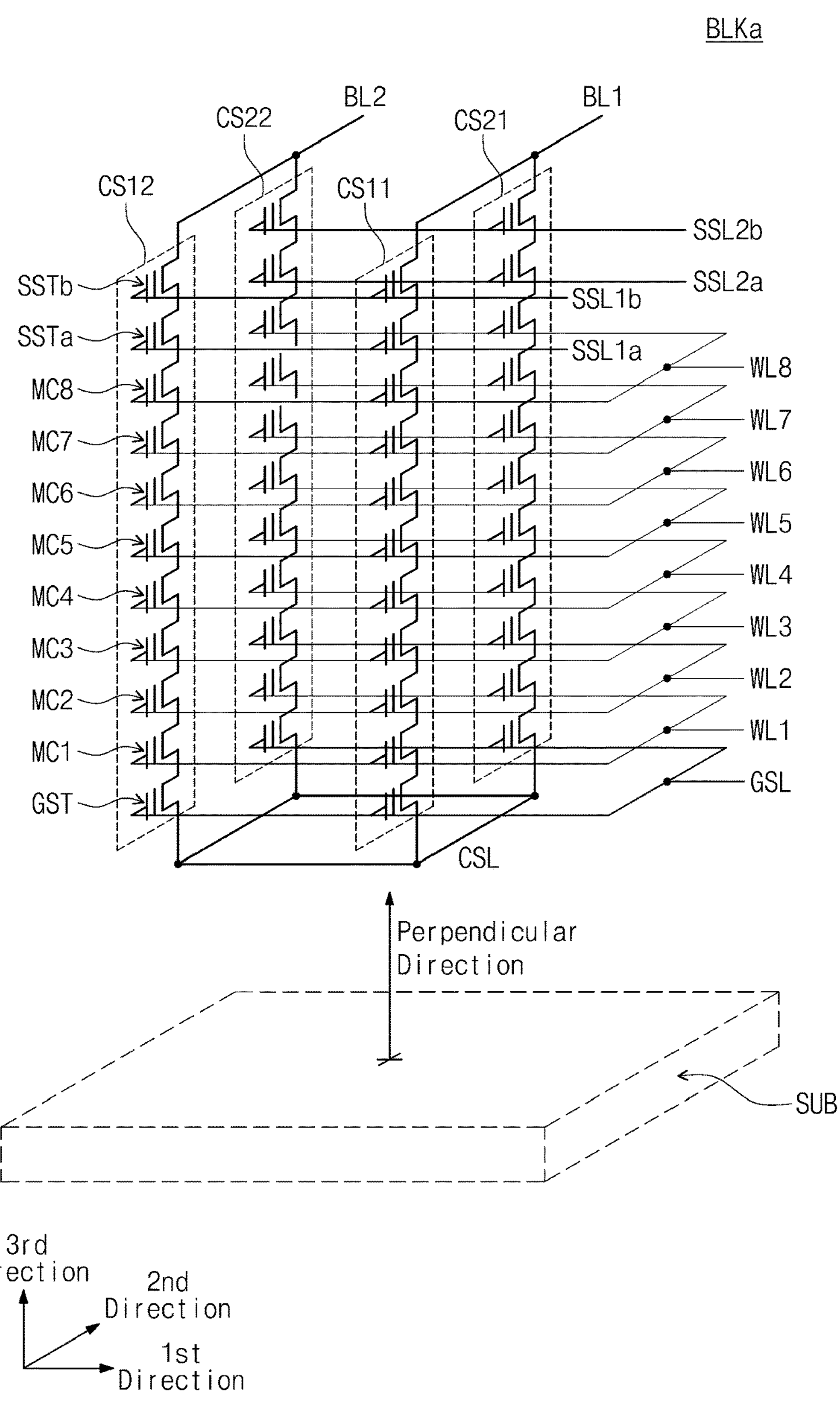
FIG. 2 is a circuit diagram illustrating an example of one memory block among memory blocks of FIG. 1.

FIG. 2 is a circuit diagram illustrating an example of one memory block BLKa among the memory blocks BLK1 to BLKz of FIG. 1. Referring to FIG. 2, a plurality of cell strings CS11, CS12, CS21, and CS22 may be arranged on a substrate SUB in rows and columns. Each row may extend along a first direction. Each column may extend along a second direction. The plurality of cell strings CS11, CS12, CS21, and CS22 may be connected in common to a common source line CSL formed on (or in) the substrate SUB. In FIG. 2, a location of the substrate SUB is depicted as an example for understanding of the structure of the memory block BLKa.

Cell strings of each row may be connected in common to the ground selection line GSL and may be connected to corresponding string selection lines among first string selection lines SSL1*a* and SSL1*b* and second string selection lines SSL2*a* to SSL2*b*. The strings of each column may be connected to a corresponding bit line among a first bit line BL1 and a second bit line BL2.

Each cell string may include at least one ground selection transistor GST connected to the ground selection line GSL and a plurality of memory cells MC1 to MC8 respectively connected to a plurality of word lines WL1 to WL8. Cell strings of the first row may further include string selection transistors SSTa and SSTb respectively connected to the first string selection lines SSL1*a* and SSL1*b*. Cell strings of the second row may further include string selection transistors SSTa and SSTb respectively connected to the second string selection lines SSL2*a* and SSL2*b*.

In each cell string, the ground selection transistor GST, the memory cells MC1 to MC8, and the string selection transistors SSTa and SSTb may be connected in series in a third direction perpendicular to an upper surface of the substrate SUB and may be sequentially stacked in the third direction perpendicular to the substrate SUB. In each of the cell strings CS11, CS12, CS21, and CS22, at least one of the memory cells MC1 to MC8 may be used as a dummy memory cell. The dummy memory cell may not be programming (e.g., may be program-inhibited) or may be programmed to be different from the remaining memory cells of the memory cells MC1 to MC8.

In an embodiment, memory cells that are located at the same height and are associated with at least one string selection line SSL1*a*, SSL1*b*, SSL2*a*, or SSL2*b* may constitute one physical page. Memory cells of one physical page may be connected to one sub-word line. Sub-word lines of physical pages located at the same height may be connected in common to one word line. Below, the term "word line" may be used to indicate a word line or a sub-word line and may be interpreted based on the context.

An embodiment in which the memory block BLKa includes the cell strings CS11, CS12, CS21, and CS22 at intersections of the first row corresponding to the first string selection lines SSL1*a* and SSL1*b*, the second row corresponding to the second string selection lines SSL2*a* and SSL2*b*, the first column corresponding to the first bit line BL1, and the second column corresponding to the second bit line BL2 is illustrated, but the numbers of rows and columns of cell strings included in the memory block BLKa are not limited thereto.

Figure 3:
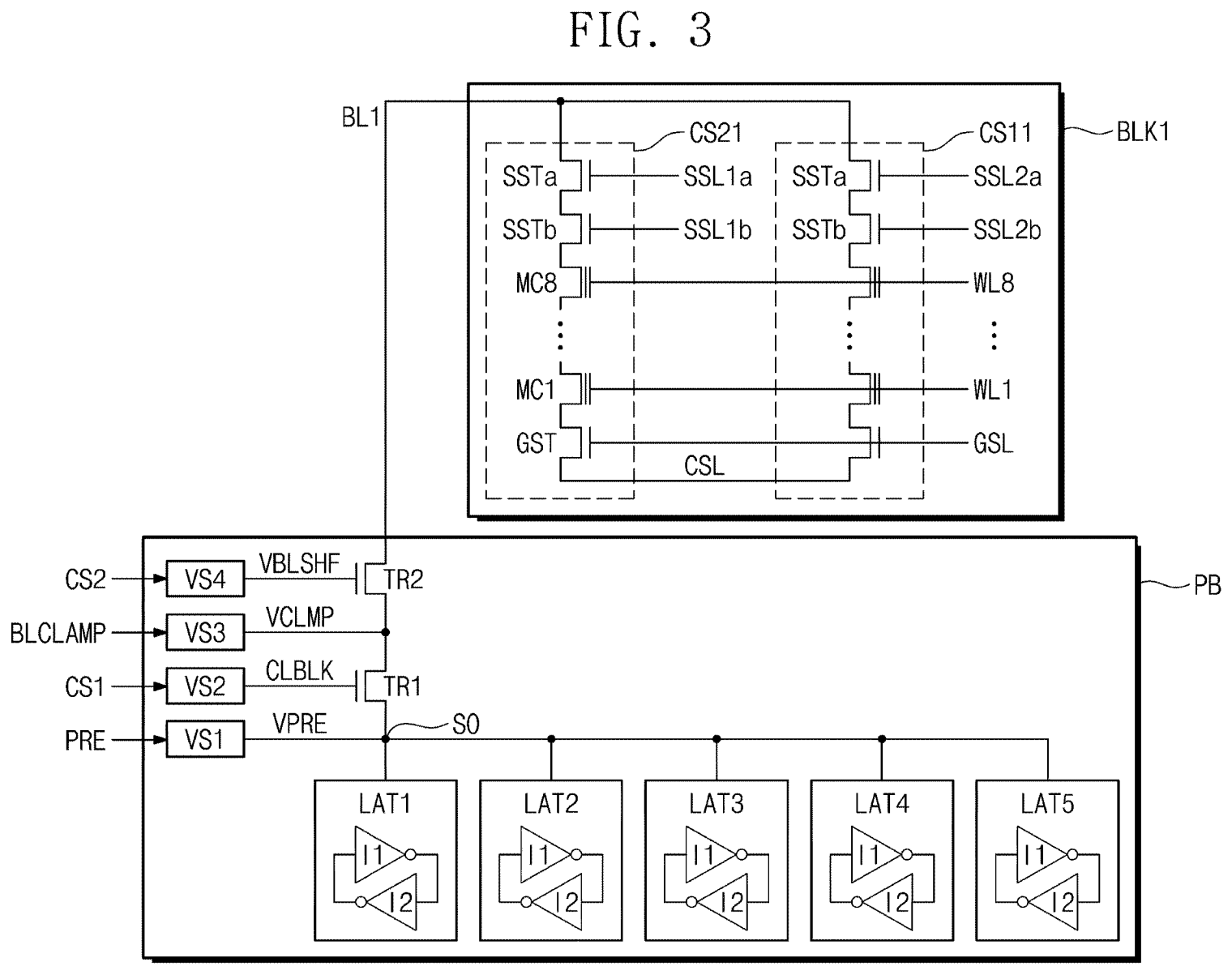

FIG. 3 illustrates an example of components of the memory cell array 110 corresponding to one bit line and components of the page buffer block 130 corresponding to one bit line. In an embodiment, an example of components of the first memory block BLK1 corresponding to the first bit line BL1 and components of the page buffer block 130 corresponding to the first bit line BL1 is illustrated in FIG. 3.

Referring to FIGS. 1, 2, and 3, the first memory block BLK1 may include the cell strings CS11 and CS21 connected to the first bit line BL1. Each of the cell strings CS11 and CS21 may include the string selection transistors SSTa and SSTb connected to the first string selection lines SSL1*a* and SSL1*b*, the string selection transistors SSTa and SSTb connected to the second string selection lines SSL2*a* and SSL2*b*, the first to eighth memory cells MC1 to MC8 connected to the first to eighth word lines WL1 to WL8, and a ground selection transistor GST connected to the ground selection line GSL. First ends of the cell strings CS11 and CS21 may be connected to the first bit line BL1, and second ends thereof may be connected to the common source line CSL.

The page buffer block 130 may include a page buffer PB connected to the first bit line BL1. In an embodiment, the page buffer block 130 may include a plurality of page buffers respectively corresponding to the plurality of bit lines BL (e.g., including the first bit line BL1 and the second bit line BL2).

The page buffer PB may include a first voltage source VS1, a second voltage source VS2, a third voltage source VS3, a fourth voltage source VS4, a first transistor TR1, a second transistor TR2, a first latch LAT1, a second latch LAT2, a third latch LAT3, a fourth latch LAT4, and a fifth latch LAT5.

The first voltage source VS1 may apply a precharge voltage VPRE to a sensing node SO in response to a precharge signal PRE. For example, the first voltage source VS1 may include a transistor, in detail, a P-type metal-oxide-semiconductor (PMOS) transistor that transfers a power supply voltage VDD (refer to FIG. 4) in response to the precharge signal PRE. For example, the precharge signal PRE may be received from the control logic block 170.

The second voltage source VS2 may output a block signal CLBLK in response to a first control signal CS1. For example, the second voltage source VS2 may be implemented with a transistor that outputs the block signal CLBLK in response to the first control signal CS1 or may be implemented with a line transferring the first control signal CS1 as the block signal CLBLK. For example, the first control signal CS1 may be received from the control logic block 170.

The third voltage source VS3 may output a clamp voltage VCLMP in response to a clamp signal BLCLAMP. For example, the third voltage source VS3 may include a transistor, in detail, an N-type metal-oxide-semiconductor (NMOS) transistor that transfers the power supply voltage VDD as the clamp voltage VCLMP in response to the clamp signal BLCLAMP. For example, the clamp signal BLCLAMP may be received from the control logic block 170.

The fourth voltage source VS4 may output a bit line voltage VBLSHF in response to a second control signal CS2. For example, the fourth voltage source VS4 may be implemented with a transistor that outputs the bit line voltage VBLSHF in response to the second control signal CS2 or may be implemented with a line transferring the second control signal CS2 as the bit line voltage VBLSHF. For example, the second control signal CS2 may be received from the control logic block 170.

The first transistor TR1 may include a first terminal connected to the second transistor TR2, a second terminal connected to the sensing node SO, and a gate connected to the second voltage source VS2. The first transistor TR1 may form or block a channel (i.e., an electrical path) between the first terminal and the second terminal in response to the block signal CLBLK.

The second transistor TR2 may include a first terminal connected to the first bit line BL1, a second terminal connected to the first transistor TR1, and a gate connected to the fourth voltage source VS4. The second transistor TR2 may form or block a channel (i.e., an electrical path) between the first terminal and the second terminal in response to the bit line voltage VBLSHF.

Each of the first latch LAT1, the second latch LAT2, the third latch LAT3, the fourth latch LAT4, and the fifth latch LAT5 may include a first inverter I1 and a second inverter 12. The first inverter I1 and the second inverter 12 may be cross-coupled with each other. For example, an output of the first inverter I1 may be connected to an input of the second inverter 12, and an output of the second inverter 12 may be connected to an input of the first inverter I1. Each of the first latch LAT1, the second latch LAT2, the third latch LAT3, the fourth latch LAT4, and the fifth latch LAT5 may store one bit based on the cross-coupled structure.

In the read operation or the verify read operation, the page buffer PB may sense a voltage of the sensing node SO by using the first latch LAT1, and thus, the electrical connection between the sensing node SO and the common source line CLS may be formed depending on whether a memory cell selected from the first to eighth memory cells MC1 to MC8 is an on-cell or an off-cell. The second latch LAT2, the third latch LAT3, the fourth latch LAT4, and the fifth latch LAT5 may be used to dump and store a sensing result (or a determination result) of the first latch LAT1. Whether the selected memory cell is an on-cell or an off-cell may be determined depending on a read voltage applied to a gate of the selected memory cell and a threshold voltage thereof.

For example, in the read operation or the verify read operation, the first voltage source VS1 may charge the sensing node SO with the precharge voltage VPRE. When the threshold voltage of the selected memory cell is greater than the read voltage applied to the gate of the selected memory cell, the selected memory cell may be an off-cell (i.e., in an off-cell state). When the selected memory cell is an off-cell, the electrical path between the sensing node SO and the common source line CSL (e.g., having a ground level) may be blocked by the selected memory cell. Accordingly, the degree to which the voltage of the sensing node SO decreases may be relatively small. For example, a voltage drop of the sensing node SO from the precharge voltage VPRE may be determined by a sub-threshold leakage current of the selected memory cell in the off-cell state.

When the threshold voltage of the selected memory cell is smaller than the read voltage applied to the gate of the selected memory cell, the selected memory cell may be an on-cell (i.e., in an on-cell state). When the selected memory cell is an on-cell, the electrical path between the sensing node SO and the common source line CSL (e.g., having a ground level) may be electrically formed by the selected memory cell. Accordingly, the degree to which the voltage of the sensing node SO decreases may be relatively great. For example, a voltage drop of the sensing node SO from the precharge voltage VPRE may be determined by a pass current of the selected memory cell in the on-cell state.

As described above, the read operation and the verify read operation may be performed by using the first latch LAT1. The reliability or accuracy of the read operation of the nonvolatile memory device 100 may be improved by implementing the first latch LAT1 with a structure robust against noise.

Figure 4:
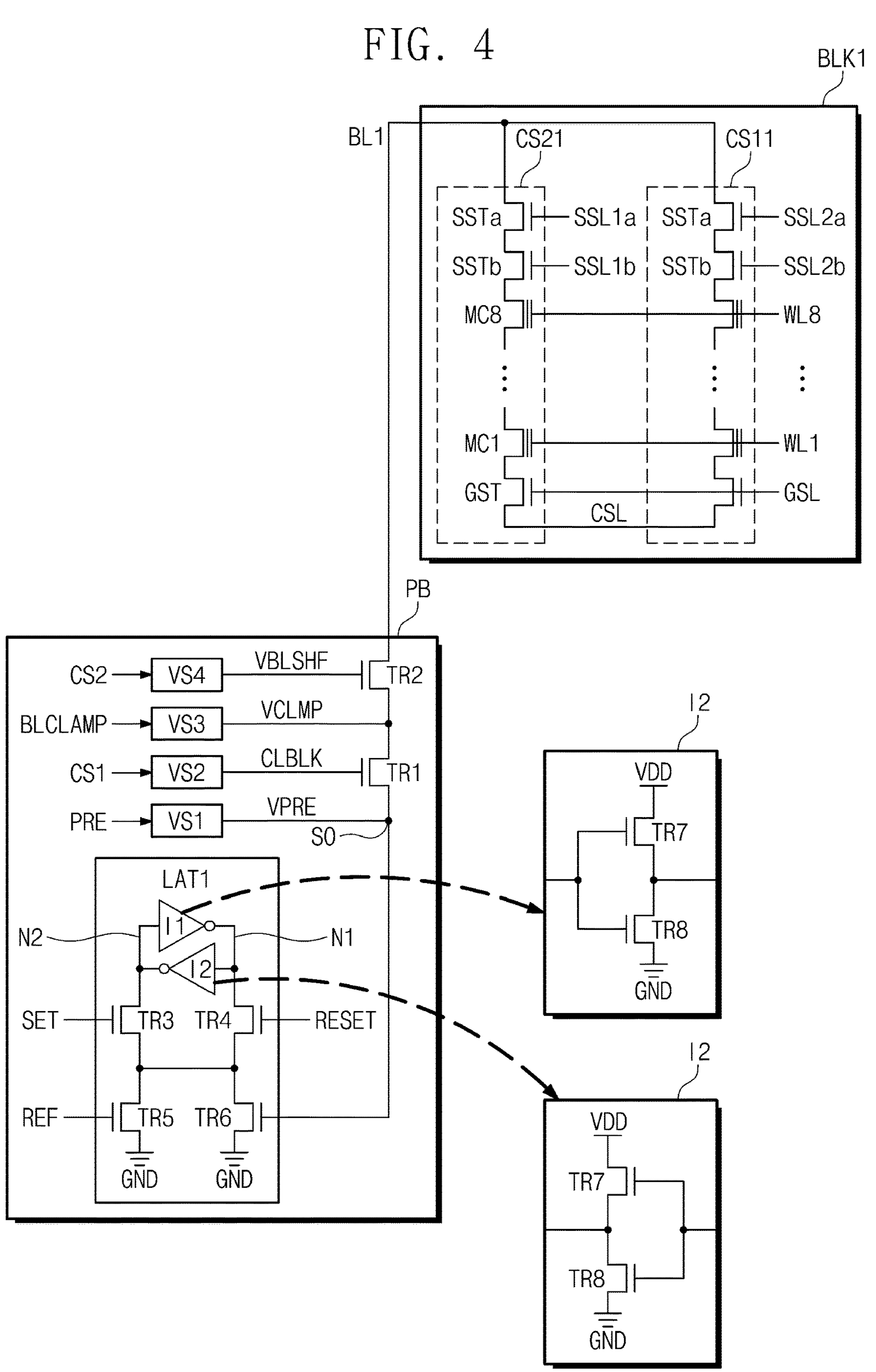
FIG. 4 illustrates a structure of a first latch of FIG. 3 in detail.

FIG. 4 illustrates a structure of the first latch LAT1 of FIG. 3 in detail. Referring to FIGS. 1 and 4, the first latch LAT1 may include the first inverter I1, the second inverter 12, a third transistor TR3, a fourth transistor TR4, a fifth transistor TR5, and a sixth transistor TR6.

The first inverter I1 may include the output connected to a first node N1 and the input connected to a second node N2. The second inverter 12 may include the output connected to the second node N2 and the input connected to the first node N1.

The third transistor TR3 may include a first terminal connected to the second node N2, a second terminal connected to the fourth transistor TR4, the fifth transistor TR5, and the sixth transistor TR6, and a gate to which a set signal SET is applied. For example, the set signal SET may be received from the control logic block 170.

The fourth transistor TR4 may include a first terminal connected to the first node N1, a second terminal connected to the third transistor TR3, the fifth transistor TR5, and the sixth transistor TR6, and a gate to which a reset signal RESET is applied. For example, the reset signal RESET may be received from the control logic block 170.

The fifth transistor TR5 may include a first terminal connected to the third transistor TR3, the fourth transistor TR4, and the sixth transistor TR6, a second terminal connected to a ground node to which a ground voltage GND is applied, and a gate to which a refresh signal REF is applied. For example, the refresh signal REF may be received from the control logic block 170.

The sixth transistor TR6 may include a first terminal connected to the third transistor TR3, the fourth transistor TR4, and the fifth transistor TR5, a second terminal connected to the ground node to which the ground voltage GND is applied, and a gate connected to the sensing node SO.

Each of the first inverter I1 and the second inverter 12 may include a seventh transistor TR7 and an eighth transistor TR8. The seventh transistor TR7 may include a first terminal connected to a power node to which the power supply voltage VDD is applied, a second terminal connected to an output node and the eighth transistor TR8, and a gate connected to an input node. The eighth transistor TR8 may include a first terminal connected to the output node and the seventh transistor TR7, a second terminal connected to the ground node to which the ground voltage GND is applied, and a gate connected to the input node.

Operations of the components of the page buffer PB may be associated with each other, which affects an operation of sensing the voltage level of the sensing node SO. For example, the operation of sensing the voltage level of the sensing node SO may be most greatly affected by parameters of some of the components of the page buffer PB, that is, the parameter (e.g., the size) of the second transistor TR2, the parameter (e.g., the voltage level) of the bit line voltage VBLSHF applied to the gate of the second transistor TR2, the parameter (e.g., the size) of the seventh transistor TR7, and the parameter (e.g., the size) of the eighth transistor TR8. The size may indicate a channel length of a transistor, a channel width, or a channel area of a transistor, which is obtained by multiplying a channel length thereof with a channel length thereof.

According to embodiments of the present disclosure, an electronic device (i.e., a circuit design system) supporting the manufacturing a flash memory with an operating characteristic robust against noise and an operating method of the electronic device may be provided to optimize the parameter (e.g., the size) of the second transistor TR2, the parameter (e.g., the voltage level) of the bit line voltage VBLSHF applied to the gate of the second transistor TR2, the parameter (e.g., the size) of the seventh transistor TR7, and the parameter (e.g., the size) of the eighth transistor TR8. In an embodiment, the electronic device may perform a reinforcement machine learning with a policy on a circuit layer.

Figure 5:
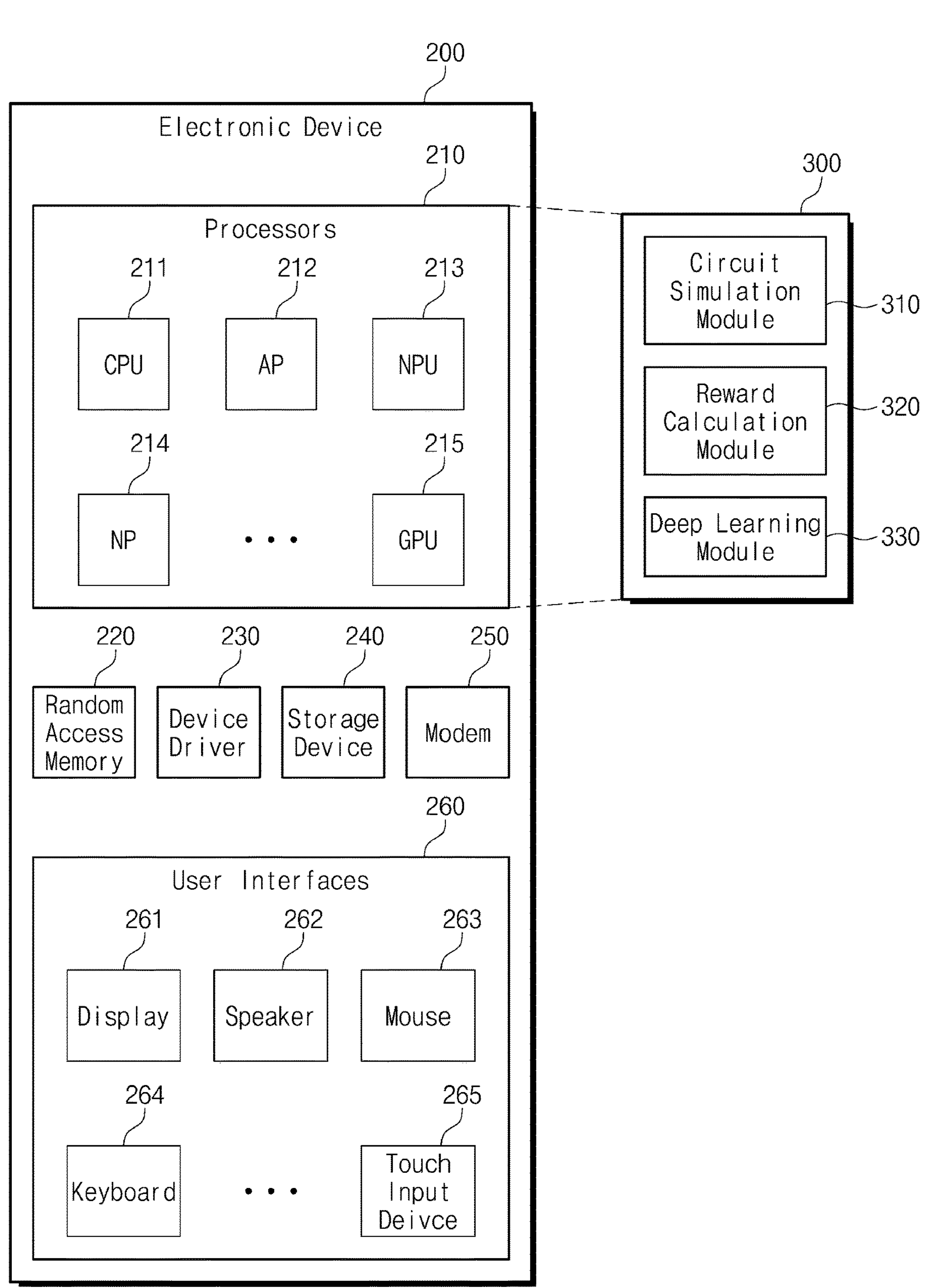
FIG. 5 is a block diagram illustrating an electronic device according to an embodiment of the present disclosure.

FIG. 5 is a block diagram illustrating an electronic device 200 (i.e., a circuit design system) according to an embodiment of the present disclosure. Referring to FIG. 5, the electronic device 200 may include processors 210, a random access memory 220, a device driver 230, a storage device 240, a modem 250, and user interfaces 260.

The processors 210 may include, for example, at least one general-purpose processor such as a central processing unit (CPU) 211 or an application processor (AP) 212. The processors 210 may further include at least one special-purpose processor such as a neural processing unit (NPU) 213, a neuromorphic processor (NP) 214, and a graphics processing unit (GPU) 215. The processors 210 may include two or more homogeneous processors.

At least one of the processors 210 may drive a semiconductor simulation module 300. For example, the semiconductor simulation module 300 may be implemented in the form of instructions (or codes) that are executed by at least one of the processors 210. In this case, the at least one processor may load the instructions (or codes) of the semiconductor simulation module 300 to the random access memory 220.

In an embodiment, at least one (or at least another) processor among the processors 210 may be manufactured to implement the semiconductor simulation module 300. For example, the at least one processor may be a dedicated processor that implements functions of the semiconductor simulation module 300 in hardware. For example, the at least one processor may be designed to perform the semiconductor simulation module 300.

The random access memory 220 may be used as a working memory of the processors 210 and may be used as a main memory or a system memory of the electronic device 200. The random access memory 220 may include a volatile memory such as a dynamic random access memory and a static random access memory, or a nonvolatile memory such as a phase-change random access memory, a ferroelectric random access memory, a magnetic random access memory, and a resistive random access memory.

The random access memory 220 may store a circuit layout necessary for the simulation of the semiconductor simulation module 300. For example, the random access memory 220 may receive the circuit layout from the storage device 240 or may receive the circuit layout from an external device (e.g., a database) through the modem 250.

The device driver 230 may control the following peripheral devices depending on a request of the processors 210: the storage device 240, the modem 250, and the user interfaces 260. The storage device 240 may include a stationary storage device such as a hard disk drive and a solid state drive, or a removable storage device such as an external hard disk drive, an external solid state drive, and a removable memory card.

The storage device 240 may store the circuit layout necessary for the simulation of the semiconductor simulation module 300. The circuit layout stored in the storage device 240 may be loaded to the random access memory 220 and may be used for learning the semiconductor simulation module 300.

The modem 250 may provide remote communication with the external device. The modem 250 may perform wired or wireless communication with the external device. The modem 250 may communicate with the external device based on at least one of various communication schemes such as Ethernet, wireless-fidelity (Wi-Fi), long term evolution (LTE), and $5^{th}$ generation (5G) mobile communication. The modem 250 may receive images, which are necessary for the learning of the semiconductor simulation module 300, from the external device, for example, the database. In an embodiment, the database may include parameters and values of the parameters which are required for simulating characteristics of a circuit represented by a circuit layout. The database may include the parameters and values thereof which are optimized for at least one process of fabricating a semiconductor device. The semiconductor simulation module 300 may receive the parameter values of the database to initialize values of the parameters adopted by the semiconductor simulation module 300. The modem 250 may load the received images to the random access memory 220.

The user interfaces 260 may receive information from the user and may provide information to the user. The user interfaces 260 may include at least one user output interface such as a display 261 and a speaker 262, and at least one user input interface such as a mouse 263, a keyboard 264, and a touch input device 265.

The instructions (or codes) of the semiconductor simulation module 300 may be received through the modem 250 and may be stored in the storage device 240. The instructions (or codes) of the semiconductor simulation module 300 may be stored in a removable storage device, and the removable storage device may be connected to the electronic device 200. The instructions (or codes) of the semiconductor simulation module 300 may be loaded and executed to the random access memory 220 from the storage device 240.

The semiconductor simulation module 300 may include a circuit simulation module 310, a reward calculation module 320, and a deep learning module 330. The circuit simulation module 310 may perform a circuit simulation based on the circuit layout stored in the random access memory 220. For example, the circuit simulation module 310 may include a commercialized circuit simulation module such as HSPICE, PrimeSim HSPICE, and FineSim HSPICE. The circuit simulation module 310 may generate reward parameters as a result of the simulation. The reward parameters may indicate, for example, features (e.g., performance, reliability, accuracy, and power consumption) of the circuit layout.

The reward calculation module 320 may receive the reward parameters generated by the circuit simulation module 310. The reward calculation module 320 may calculate a reward based on the reward parameters. The reward may indicate a score that is obtained by digitizing the features (e.g., performance, reliability, accuracy, and power consumption) of the circuit layout. For example, the score may be obtained by considering weight of each of the reward parameters. The reward will be calculated using an equation as shown in Equation 1 which will be described.

The deep learning module 330 may control the circuit simulation module 310 and the reward calculation module 320. The deep learning module 330 may control the circuit simulation module 310 and the reward calculation module 320 such that the simulation of the circuit simulation module 310 and the reward calculation of the reward calculation module 320 are iterated. In the process of iterating the simulation and the reward calculation, the deep learning module 330 may adjust (or revise) the parameter (e.g., the size) of the second transistor TR2, the parameter (e.g., the voltage level) of the bit line voltage VBLSSHF applied to the gate of the second transistor TR2, the parameter (e.g., the size) of the seventh transistor TR7, and the parameter (e.g., the size) of the eighth transistor TR8 based on a policy. In an embodiment, the deep learning module 330 may be implemented using reinforcement machine learning with a policy.

The deep learning module 330 may perform deep learning based on a result of iterative simulations and reward calculations. By revising the policy depending on a result of the deep learning, the deep learning module 330 may optimize the parameter (e.g., the size) of the second transistor TR2, the parameter (e.g., the voltage level) of the bit line voltage VBLSHF applied to the gate of the second transistor TR2, the parameter (e.g., the size) of the seventh transistor TR7, and the parameter (e.g., the size) of the eighth transistor TR8.

Figure 6:
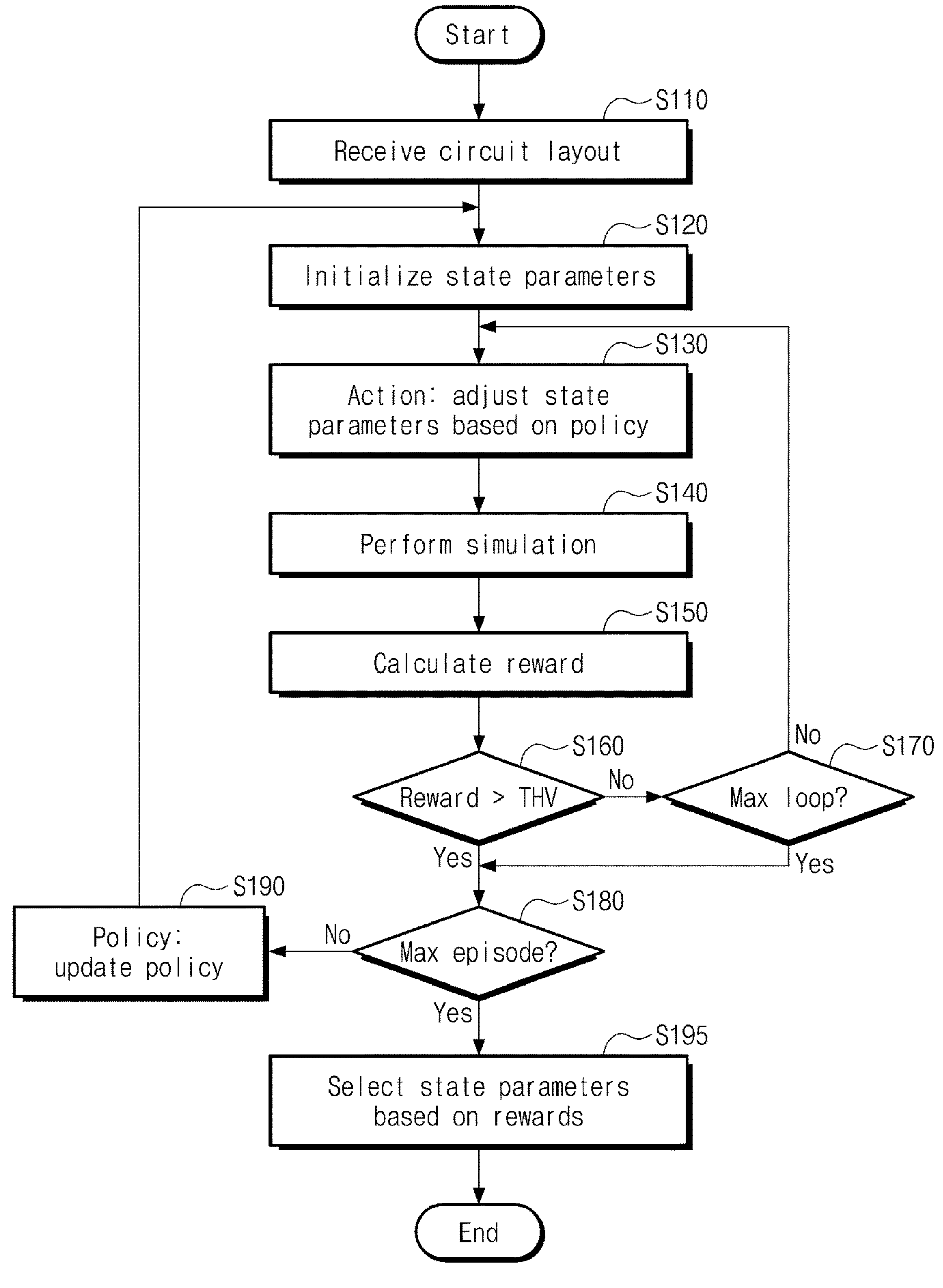
FIG. 6 illustrates an operating method of an electronic device according to an embodiment of the present disclosure.

FIG. 6 illustrates an operating method of the electronic device 200 according to an embodiment of the present disclosure. Referring to FIGS. 5 and 6, in operation S110, the electronic device 200 may receive a circuit layout. For example, the electronic device 200 may receive the circuit layout through the modem 250 and may store the received circuit layout in the random access memory 220 or the storage device 240.

In operation S120, the electronic device 200 may initialize state parameters. The state parameters may include parameters being an optimization target. The state parameters may include the parameter (e.g., the size) of the second transistor TR2, the parameter (e.g., the voltage level) of the bit line voltage VBLSHF applied to the gate of the second transistor TR2, the parameter (e.g., the size) of the seventh transistor TR7, and the parameter (e.g., the size) of the eighth transistor TR8. The electronic device 200 may initialize the state parameters to an initial value that is determined in the design of the circuit layout. For example, the circuit simulation module 310 of the semiconductor simulation module 300 executed by the processors 210 may read the circuit layout from the random access memory 220 and may initialize the state parameters of the circuit layout.

In operation S130, the electronic device 200 may perform an action. For example, the electronic device 200 may adjust the state parameters based on a policy. The deep learning module 330 of the semiconductor simulation module 300 executed by the processors 210 may adjust the state parameters based on the policy. The policy may include information about directions of adjusting the state parameters, for example, probabilities of taking actions at the state parameters. For example, the policy may include a plurality of probabilities of taking actions, respectively, at given parameters. In some embodiments, the actions may include opposite actions for each of given parameters (e.g., an action of increasing of a parameter and an action of decreasing of the parameter).

In operation S140, the electronic device 200 may perform a simulation on the circuit layout. For example, the circuit simulation module 310 of the semiconductor simulation module 300 executed by the processors 210 may perform the simulation on the circuit layout based on the state parameters. The circuit simulation module 310 may perform the simulation on the circuit layout using the state parameters and may detect or may set reward parameters from the simulation result. The reward parameters may indicate, for example, features (e.g., performance, reliability, accuracy, and power consumption) of the circuit layout.

In operation S150, the electronic device 200 may calculate a reward. For example, the reward calculation module 320 of the semiconductor simulation module 300 executed by the processors 210 may calculate the reward based on the reward parameters. The reward may indicate a score that is obtained by digitizing the features (e.g., performance, reliability, accuracy, and power consumption) of the circuit layout. For example, the score may be obtained by considering weight of each of the reward parameters. The reward will be calculated using an equation as shown in Equation 1 which will be described.

In operation S160, the electronic device 200 may determine whether the reward is greater than a threshold value THV. For example, the deep learning module 330 of the semiconductor simulation module 300 executed by the processors 210 may determine whether the calculated reward is greater than the threshold value THV. The threshold value THV may be determined by the user. For example, the threshold value THV may be empirically set by the user.

When the reward is not greater than the threshold value THV, in operation S170, the electronic device 200 may determine whether a current loop reaches the maximum loop. For example, the deep learning module 330 of the semiconductor simulation module 300 executed by the processors 210 may determine whether the number of action loops reaches the maximum loop. In an embodiment, the maximum loop may be determined by the user.

When the current loop does not reach the maximum loop, the electronic device 200 may again perform operation S130. In an embodiment, operation S130, operation S140, operation S150, operation S160, and operation S170 may form one action loop. When the reward is not greater than the threshold value THV and the number of action loops does not reach the maximum loop, the electronic device 200 may repeat the action loop.

When the reward is greater than the threshold value THV or when the number of action loops reaches the maximum loop, in operation S180, the electronic device 200 may determine whether a current episode reaches the maximum episode. For example, the deep learning module 330 of the semiconductor simulation module 300 executed by the processors 210 may determine whether the number of episodes reaches the maximum episode. In an embodiment, the maximum episode may be determined by the user.

When the current episode does not reach the maximum episode, in operation S190, the electronic device 200 may update a policy. For example, the deep learning module 330 of the semiconductor simulation module 300 executed by the processors 210 may update the policy. For example, the deep learning module 330 of the semiconductor simulation module 300 executed by the processors 210 may update the policy based on the deep learning. Afterwards, the electronic device 200 may again perform operation S120.

In an embodiment, operation S120, operation S130, operation S140, operation S150, operation S160, operation S170, operation S180, and operation S190 may form one episode. When the number of episodes does not reach the maximum episode, the electronic device 200 may repeat the episode. In the first episode, the operation S120 of initializing state parameters may be performed using initial values of the parameters associated with circuit simulation performed by the semiconductor simulation module 300. The initial values may be received from an external database. In an embodiment, in the subsequent episode, the operation S120 of initializing state parameters may be set the parameters to values of the parameters which are adjusted in the previous episode.

In each episode, the electronic device 200 may perform actions depending on the policy and may increase a reward corresponding to the policy. The electronic device 200 may execute the episodes and may train or update the policy in a direction of increasing the reward. For example, while performing the episodes, the electronic device 200 may collect rewards greater than the threshold value THV, relevant actions, relevant state parameters, and relevant reward parameters. The deep learning module 330 of the semiconductor simulation module 300 executed by the processors 210 may perform learning based on at least some of the rewards greater than the threshold value THV, the relevant actions, the relevant state parameters, and the relevant reward parameters and may update the policy. For example, the deep learning module 330 may update the policy using simulation results of which rewards are greater than the threshold value THV, thereby approaching to optimized values of the parameters by repeating such updates (i.e., may update the policy in a direction of increasing the reward).

When the number of episodes reaches the maximum episode, in operation S195, the electronic device 200 may select the state parameters based on the rewards. For example, the deep learning module 330 of the semiconductor simulation module 300 executed by the processors 210 may select state parameters corresponding to the greatest reward as final state parameters, for example, optimized state parameters.

Figure 7:
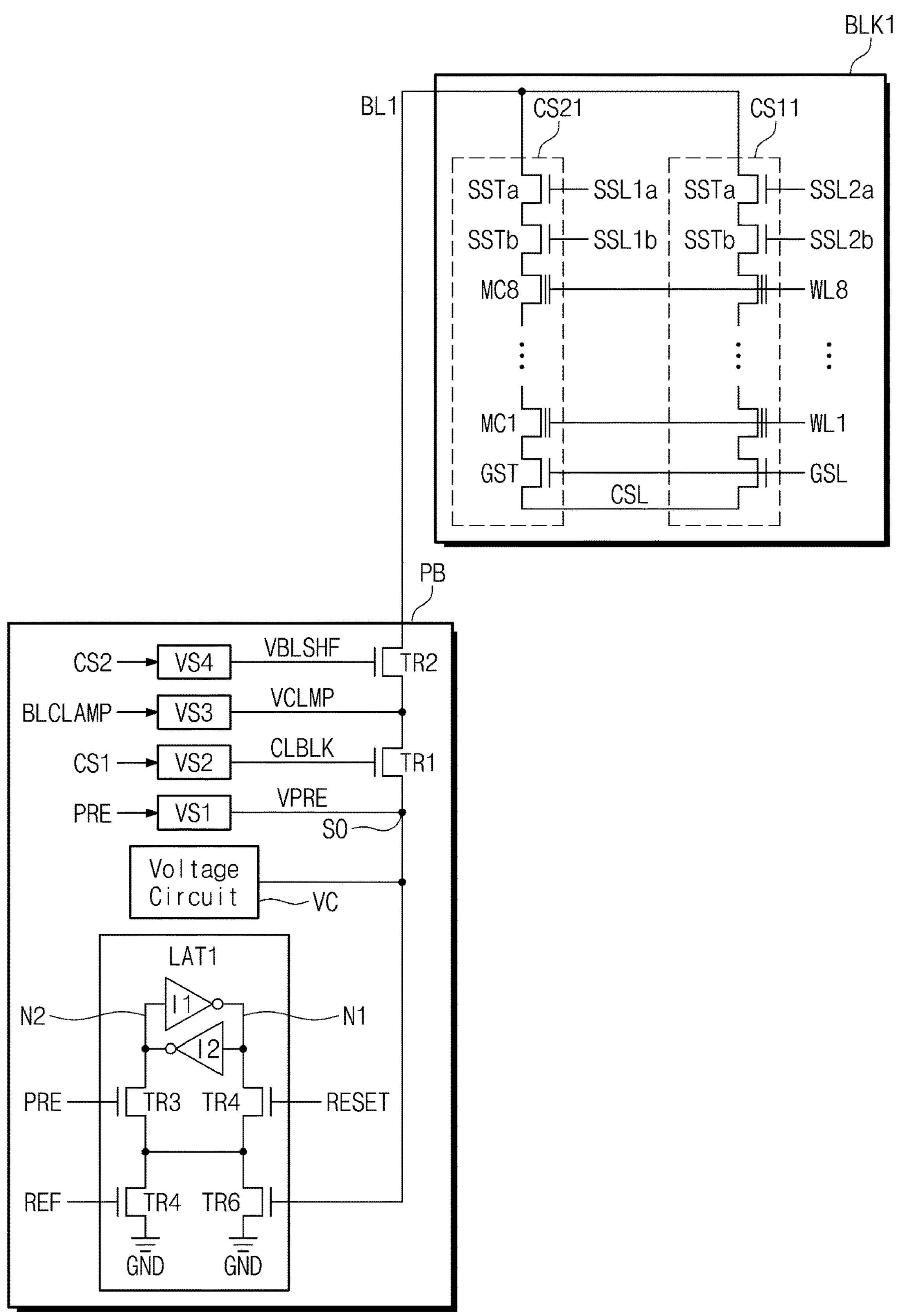
FIG. 7 illustrates an example of a circuit layout input to a circuit simulation module.

FIG. 7 illustrates an example of a circuit layout input to the circuit simulation module 310. Compared to the circuit layout of FIG. 4, the page buffer PB of FIG. 7 may further include a voltage circuit VC. The voltage circuit VC may output a voltage to the sense node SO. For example, the voltage circuit VC may apply a voltage, which gradually increases from the ground voltage GND to the power supply voltage VDD, to the sensing node SO.

The voltage circuit VC may be a component added for the simulation of the semiconductor simulation module 300. For example, the voltage circuit VC may be added by the circuit simulation module 310. An actual circuit layout that is used in manufacturing a semiconductor device may not include the voltage circuit VC. A semiconductor device that is manufactured based on the circuit layout may not include the voltage circuit VC.

Figure 8:
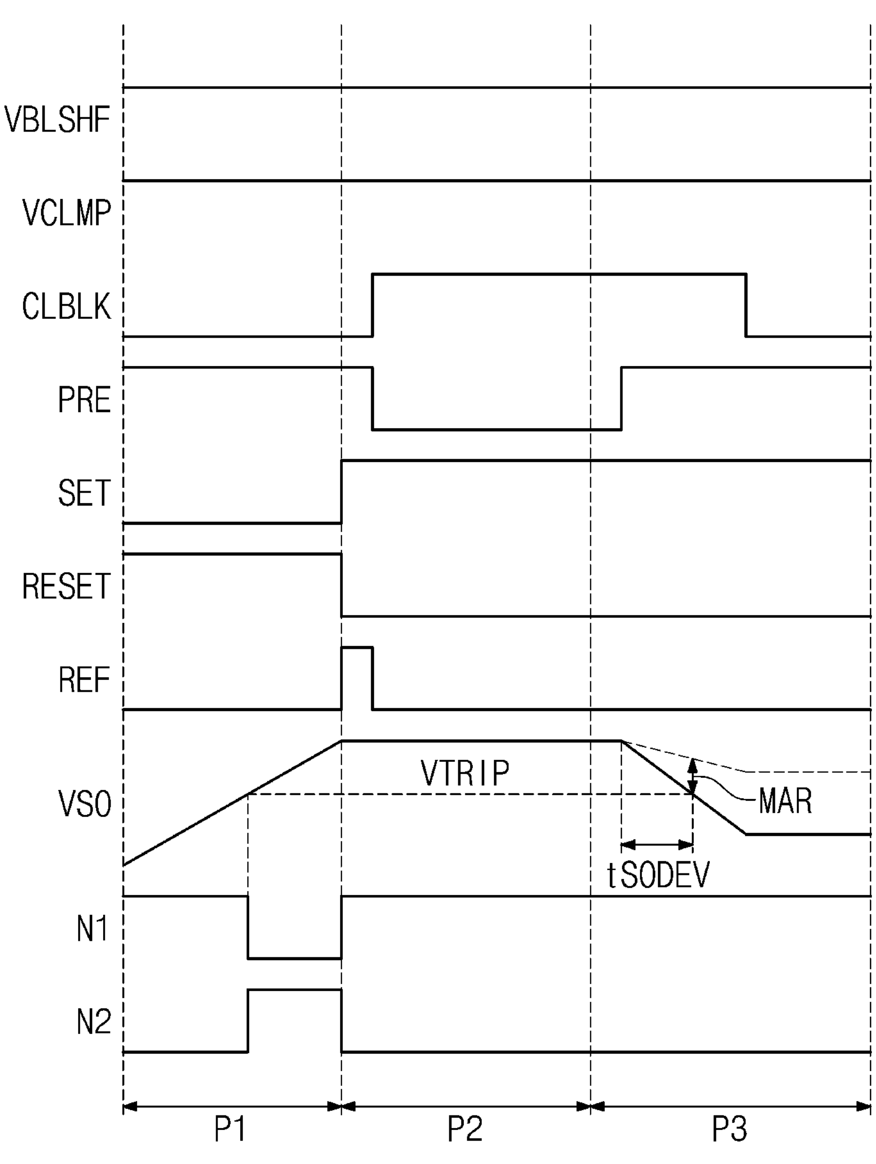
FIG. 8 illustrates an example in which a circuit simulation is performed based on a circuit layout.

FIG. 8 illustrates an example in which a circuit simulation is performed based on a circuit layout. A timing diagram of signals of the circuit layout of FIG. 7 is illustrated in FIG. 8. Referring to FIGS. 7 and 8, the circuit simulation may be performed in order of a first phase P1, a second phase P2, and a third phase P3.

In the first phase P1, the circuit simulation module 310 may detect a trip voltage VTRIP. For example, the trip voltage VTRIP may refer to a voltage at which a bit stored in the first latch LAT1 is inverted.

In an embodiment, in the action (refer to operation S130 of FIG. 6), the deep learning module 330 may adjust the parameter (e.g., the size) of the second transistor TR2, the parameter (e.g., the voltage level) of the bit line voltage VBLSSHF applied to the gate of the second transistor TR2, the parameter (e.g., the size) of the seventh transistor TR7, or the parameter (e.g., the size) of the eighth transistor TR8.

When the parameter (e.g., the size) of the seventh transistor TR7 or the parameter (e.g., the size) of the eighth transistor TR8 is adjusted, the threshold voltage of the seventh transistor TR7 or the eighth transistor TR8 may be adjusted. Accordingly, a voltage level at which a bit stored in the first latch LAT1 is inverted may be adjusted. The circuit simulation module 310 may detect the trip voltage VTRIP in the first phase P1 and may detect (i.e., may set) reward parameters based on the trip voltage VTRIP.

In the first phase P1, the circuit simulation module 310 may maintain the bit line voltage VBLSHF at a level determined by the action (refer to operation S130 of FIG. 6). The circuit simulation module 310 may maintain the clamp voltage VCLMP at the high level. As the circuit simulation module 310 maintains the block signal CLBLK at the low level, the first bit line BL1 and the sensing node SO may be electrically disconnected.

In the first phase P1, the circuit simulation module 310 may maintain the precharge signal PRE at the high level. The precharge voltage VPRE may maintain the low level in response to the precharge signal PRE. The circuit simulation module 310 may maintain the set signal SET at the low level to turn off the third transistor TR3. The circuit simulation module 310 may maintain the reset signal RESET at the high level to turn on the fourth transistor TR4.

In the first phase P1, the circuit simulation module 310 may maintain the refresh signal REF at the low level to turn off the fifth transistor TR5. The circuit simulation module 310 may set an initial value of the first node N1 to the high level and may set an initial value of the second node N2 to the low level.

In the first phase P1, the circuit simulation module 310 may allow the voltage circuit VC to output a voltage that gradually increases from the voltage level of the low level to the voltage level of the high level. By the voltage circuit VC, a sensing node voltage VSO of the sensing node SO may gradually increase from the voltage level of the low level to the voltage level of the high level.

Because the fourth transistor TR4 is turned on by the reset signal RESET, when the sixth transistor TR6 is turned on by the sensing node voltage VSO, the voltage of the first node N1 may transition from the high level to the low level. The circuit simulation module 310 may detect the sensing node voltage VSO, which corresponds to a point in time when the voltage of the first node N1 transitions from the high level to the low level or the voltage of the second node N2 transitions from the low level to the high level, as the trip voltage VTRIP.

In the second phase P2, the circuit simulation module 310 may perform a preparation operation for the sensing of reward parameters.

In the second phase P2, the circuit simulation module 310 may maintain the bit line voltage VBLSHF at the level determined by the action (refer to operation S130 of FIG. 6). The circuit simulation module 310 may maintain the clamp voltage VCLMP at the high level.

In the second phase P2, the circuit simulation module 310 may allow the set signal SET to transition to the high level such that the third transistor TR3 is turned on. The circuit simulation module 310 may allow the reset signal RESET to transition to the low level such that the fourth transistor TR4 is turned off. The circuit simulation module 310 may allow the refresh signal REF to transition to the high level such that the fifth transistor TR5 is turned on.

The second node N2 may be connected to the ground node, to which the ground voltage GND is applied, through the third transistor TR3 and the fifth transistor TR5. For example, the second node N2 may be initialized to the low level, and the first node N1 may be initialized to the high level. After the level of the first node N1 and the level of the second node N2 are initialized, the circuit simulation module 310 may allow the refresh signal REF to transition to the low level such that the fifth transistor TR5 is turned off. The circuit simulation module 310 may allow the block signal CLBLK to transition to the high level such that the first bit line BL1 and the sensing node SO are electrically connected. The circuit simulation module 310 may allow the precharge signal PRE to the low level such that the sensing node SO is charged with the precharge voltage VPRE of the high level. The voltage of the sensing node SO may be maintained at the high level.

In the third phase P3, the circuit simulation module 310 may detect reward parameters. For example, the circuit simulation module 310 may measure the reward parameters such as a sensing node develop time tSODEV and a margin MAR based on the trip voltage VTRIP. The sensing node develop time tSODEV and the margin MAR will be described later.

In the third phase P3, the circuit simulation module 310 may allow the precharge signal PRE to transition to the high level such that the supply of the precharge voltage VPRE is stopped. After the supply of the precharge voltage VPRE is stopped, the circuit simulation module 310 may apply the read pass voltage to the first string selection lines SSL1*a* and SSL1*b*, the second string selection lines SSL2*a* and SSL2*b*, and the ground selection line GSL. The read pass voltage may be a voltage high enough to turn on the string selection transistors SSTa and SSTb and the ground selection transistor GST.

The circuit simulation module 310 may apply the ground voltage GND to the common source line CSL. The circuit simulation module 310 may apply the read voltage to one word line among the first to eighth word lines WL1 to WL8 and may apply the read pass voltage to the remaining word lines. The read pass voltage may be a voltage high enough to turn on memory cells.

When the threshold voltage of the memory cell connected to the one word line is smaller than the read voltage, the memory cell that is an on-cell may be turned on. The sensing node voltage VSO may be discharged to the common source line CSL through the string selection transistors SSTa and SSTb turned on by the read pass voltage, the memory cells turned on by the read pass voltage, the on-cell turned on by the read voltage, and the ground selection transistor GST turned on by the read pass voltage.

Because the clamp voltage VCLMP corresponds to the high level, the sensing node voltage VSO may gradually decrease. In an embodiment, the change in the sensing node voltage VSO indicated by a solid line in the third phase P3 may be associated with an on-cell.

When the threshold voltage of the memory cell connected to the one word line is greater than the read voltage, the memory cell that is an off-cell may be turned off. The sensing node voltage VSO may be leaked out to the common source line CSL through the string selection transistors SSTa and SSTb turned on by the read pass voltage, the memory cells turned on by the read pass voltage, the off-cell turned off by the read voltage, and the ground selection transistor GST turned on by the read pass voltage.

The degree to which the sensing node voltage VSO decreases due to the leakage of the off-cell may be smaller than the degree to which the sensing node voltage VSO decreases due to the discharge of the on-cell. Because the clamp voltage VCLMP corresponds to the high level, the sensing node voltage VSO may gradually decrease. In an embodiment, the change in the sensing node voltage VSO indicated by a dashed line in the third phase P3 may be associated with an off-cell.

The circuit simulation module 310 may detect a time, which is taken for the sensing node voltage VSO to decrease from the high level to the trip voltage VTRIP (or to reach the trip voltage VTRIP) through the on-cell, as a sensing node develop time tSODEV. When the sensing node develop time tSODEV ends, the circuit simulation module 310 may detect a difference between the sensing node voltage VSO corresponding to the on-cell and the sensing node voltage VSO corresponding to the off-cell, as a margin MAR. For example, the circuit simulation module 310 may measure the sensing node develop time tSODEV from a selected memory cell in an on-cell state, and then measure a voltage of the sensing node SO connected to a selected memory cell in an off-cell state at the sensing node develop time tSODEV. In an embodiment, the selected memory cell in the on-cell state and the selected memory cell in the off-cell state may be the same memory cell. The present invention is not limited thereto. In an embodiment, the selected memory cell in the on-cell state may be different from the selected memory cell in the off-cell state.

In the third phase P3, the circuit simulation module 310 may calculate power consumption of the first latch LAT1. The circuit simulation module 310 may detect the sensing node develop time tSODEV, the margin MAR, the power consumption as the reward parameters.

In an embodiment, the circuit simulation module 310 may perform the simulation corresponding to the on-cell by using the first latch LAT1 of the page buffer PB connected to the first bit line BL1 and may perform the simulation corresponding to the off-cell by using the first latch LAT1 of the page buffer PB connected to the second bit line BL2. For example, the circuit simulation module 310 may detect the reward parameters by performing the first phase P1, the second phase P2, and the third phase P3 in parallel.

In an embodiment, the circuit simulation module 310 may perform circuit simulation on the first latch LAT1 of the page buffer PB that is connected to the first bit line BL1 in three subsequent phases including the first phase P1, the second phase P2, the third phase P3 corresponding to the on-cell, and the third phase P3 corresponding to the off-cell.

When the simulation is completed, the circuit simulation module 310 may output, as the reward parameters, the sensing node develop time tSODEV, the margin MAR, the power consumption, the bit line voltage VBLSHF, the size of the second transistor TR2, the size of the seventh transistor TR7, and the size of the eighth transistor TR8. Because the size of the second transistor TR2, the size of the seventh transistor TR7, and the size of the eighth transistor TR8 affects the size of the page buffer PB, the size of the second transistor TR2, the size of the seventh transistor TR7, and the size of the eighth transistor TR8 may be used as the reward parameters indicating features of the page buffer PB.

Figure 9:
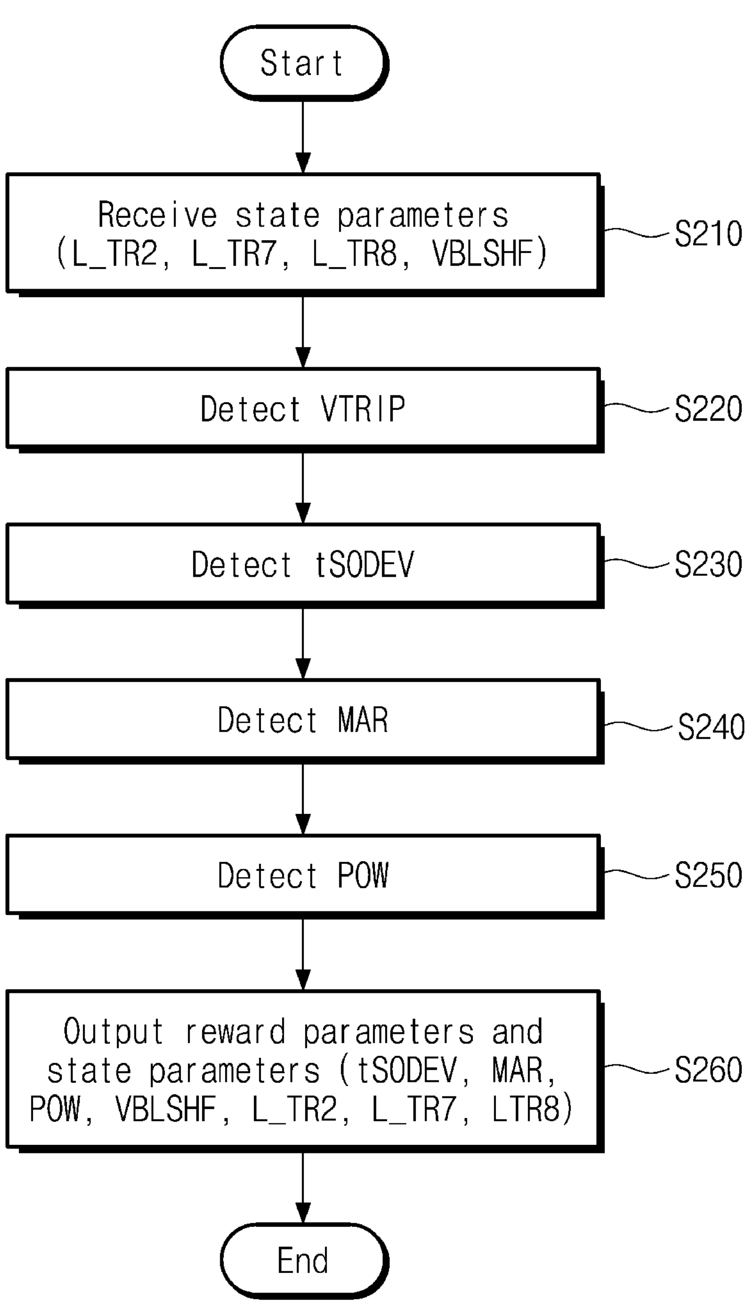
FIG. 9 illustrates an example of a process in which an electronic device performs a circuit simulation.

FIG. 9 illustrates an example of a process in which the electronic device 200 performs a circuit simulation. Referring to FIGS. 5, 8, and 9, the electronic device 200 may receive state parameters. For example, the circuit simulation module 310 of the semiconductor simulation module 300 executed by the processors 210 may receive first length information L_TR2 corresponding to the second transistor TR2, second length information L_TR7 corresponding to the seventh transistor TR7, third length information L_TR8 corresponding to the eighth transistor TR8, and level information of the bit line voltage VBLSSHF from the deep learning module 330.

In an embodiment, there may be a limitation on adjusting widths of channels of transistors in the process of designing and manufacturing a semiconductor device. Accordingly, the widths of the channels of the transistors may be determined to be identical to each other. The size of the transistors may be adjusted by adjusting lengths of the channels of the transistors, that is, a distance between a source and a drain of each transistor. Accordingly, the first length information L_TR2, the second length information L_TR7, and the third length information L_TR8 may be included as the state parameters.

In operation S220, the electronic device 200 may detect the trip voltage VTRIP. For example, the circuit simulation module 310 of the semiconductor simulation module 300 executed by the processors 210 may set the second transistor TR2, the seventh transistor TR7, the eighth transistor TR8, and the bit line voltage VBLSHF based on the received state parameters. By performing the first phase P1 based on the settings, the circuit simulation module 310 of the semiconductor simulation module 300 executed by the processors 210 may detect the trip voltage VTRIP.

In operation S230, the electronic device 200 may detect the sensing node develop time tSODEV. For example, the circuit simulation module 310 of the semiconductor simulation module 300 executed by the processors 210 may detect the sensing node develop time tSODEV by performing the second phase P2 and the third phase P3.

In operation S240, the electronic device 200 may detect the margin MAR. For example, the circuit simulation module 310 of the semiconductor simulation module 300 executed by the processors 210 may detect the margin MAR from an execution result of the second phase P2 and the third phase P3.

In operation S250, the electronic device 200 may detect power consumption POW. For example, the circuit simulation module 310 of the semiconductor simulation module 300 executed by the processors 210 may detect the power consumption POW from the execution result of the second phase P2 and the third phase P3.

In operation S260, the electronic device 200 may output reward parameters and state parameters. For example, the circuit simulation module 310 of the semiconductor simulation module 300 executed by the processors 210 may output the sensing node develop time tSODEV, the margin MAR, and the power consumption POW as the reward parameters. The circuit simulation module 310 of the semiconductor simulation module 300 executed by the processors 210 may output the bit line voltage VBLSHF, the first length information L_TR2, the second length information L_TR7, and the third length information L_TR8 as the state parameters.

Figure 10:
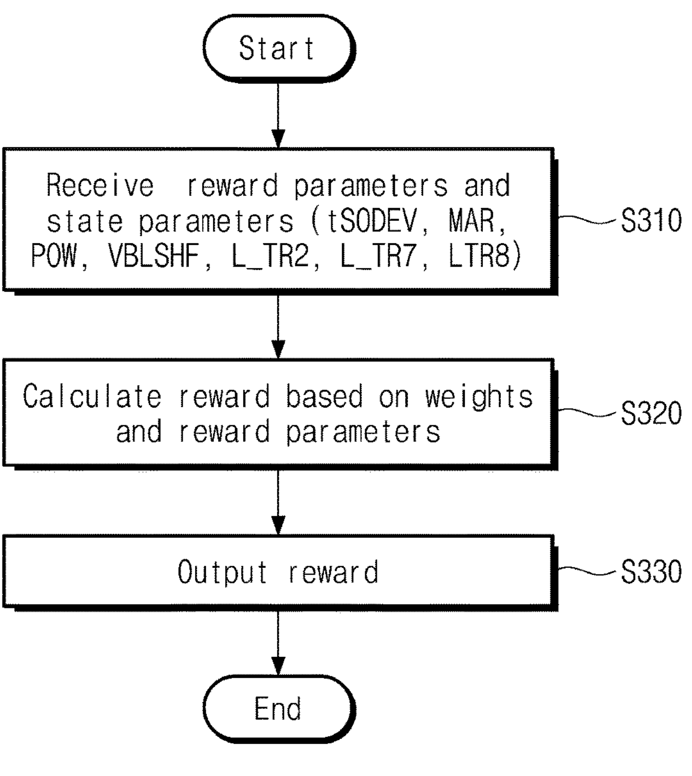
FIG. 10 illustrates an example of a process in which an electronic device calculates a reward.

FIG. 10 illustrates an example of a process in which the electronic device 200 calculates a reward. Referring to FIGS. 5 and 10, in operation S310, the electronic device 200 may receive reward parameters and state parameters. For example, the reward calculation module 320 of the semiconductor simulation module 300 executed by the processors 210 may receive the sensing node develop time tSODEV, the margin MAR, and the power consumption POW from the circuit simulation module 310. The reward calculation module 320 of the semiconductor simulation module 300 executed by the processors 210 may receive the state parameters including the bit line voltage VBLSHF, the first length information L_TR2, the second length information L_TR7, and the third length information L_TR8 from the circuit simulation module 310.

In operation S320, the electronic device 200 may calculate a reward based on weights and the reward parameters. For example, the reward calculation module 320 of the semiconductor simulation module 300 executed by the processors 210 may calculate the reward based on the reward parameters and the weights determined by the user. In an embodiment, a reward RW may be calculated based on Equation 1 below.

$$RW = \left(\alpha \cdot \frac{tSODEV}{\mathrm{tSODEV\_T}} + \beta \cdot \frac{MAR}{\mathrm{MAT\_T}} + \gamma \cdot \frac{POW}{\mathrm{POW\_T}}\right) \times \frac{AR}{\mathrm{AR\_T}} \times \sigma_{VTHlat} \times WLF \quad \text{[Equation 1]}$$

In Equation 1 above, tSODEV_T may be a target time of the sensing node develop time tSODEV, MAR_T may be a target value of the margin MAR, POW_T may be a target value of the power consumption POW, AR_T may be a sum or an average of target areas of the second transistor TR2, the seventh transistor TR7, and the eighth transistor TR8, and α, β, and δ may correspond to weights and may be determined experimentally by the user or based on the product specification. The target areas of the transistors TR2, TR7, and TR8 may be obtained by multiplying a respective channel length to a respective channel width.

In Equation 1 above, AR may be a sum or an average of the areas of the second transistor TR2, the seventh transistor TR7, and the eighth transistor TR8 and may be calculated based on a length of a common width of transistors, the first length information L_TR2, the second length information L_TR7, and the third length information L_TR8.

In Equation 1 above, $\sigma_{VTHlat}$ may be a constant that is used to apply a threshold voltage change of the seventh transistor TR7 and the eighth transistor TR8 of the first latch LAT1 (refer to FIG. 7) due to a process variation. In an embodiment, the threshold voltage change $\sigma_{VTH}$ of a transistor due to the process variation may be determined by Equation 2 above based on the Pelgrom's model.

$$\sigma_{VTH} \propto \frac{Avt}{\sqrt{LW}} \quad \text{[Equation 2]}$$

In Equation 2 above, Avt may be a constant that is determined by a process feature, L may be a length of a channel of a transistor, and W may be a width of a channel of a transistor. For example, LW denotes that L is multiplied by W, and thus LW represents an area (i.e., a channel area) of the transistor. The process feature may include features such as a number of processes of each kind of processes, an order of processes, materials used in the processes, temperatures of each processes, etc.

When the seventh transistor TR7 and the eighth transistor TR8 of a latch are transistors independent of each other, $\sigma_{VTHlat}$ may be determined by Equation 3 below.

$$\sigma_{VTHlat} = \sqrt{\sigma^2_{VTH\_TR7} + \sigma^2_{VTH\_TR8}} \quad \text{[Equation 3]}$$

In Equation 3 above, $\sigma_{VTH\_TR7}$ may correspond to a threshold voltage change of the seventh transistor TR7 due to the process variable, and $\sigma_{VTH\_TR8}$ may correspond to a threshold voltage change of the eighth transistor TR8 due to the process variable.

In an embodiment, the seventh transistor TR7 and the eighth transistor TR8 may be manufactured by the same process and may have the same width. Accordingly, based on Equation 2 and Equation 3 above, $\sigma_{VTHlat}$ may be calculated by Equation 4 below.

$$\sigma_{VTHlat} \propto \sqrt{\frac{Avt^2}{W}\cdot\frac{1}{L_{TR7}}+\frac{Avt^2}{W}\cdot\frac{1}{L_{TR8}}} \propto \sqrt{\frac{1}{L_{TR7}}+\frac{1}{L_{TR8}}} \quad \text{[Equation 4]}$$

In Equation 4 above, $L_{TR7}$ may correspond to a channel length of the seventh transistor TR7, and $L_{LTR8}$ may correspond to a channel length of the eighth transistor TR8.

Because $\sigma_{VTHlat}$ is a value determined by the proportion, $L_{TR7}$ may be used to calculate $\sigma_{VTHlat}$ by using a value normalized by an initial value. $L_{TR8}$ may be used to calculate $\sigma_{THlat}$ by using a value normalized by an initial value In Equation 1 above, WLF may be a word line factor and may be used to minimize a change in a word line voltage (e.g., a voltage of a word line connected to an on-cell or an off-cell) by minimizing a change in a cell current (e.g., an on-cell current or an off-cell current). For example, the word line factor WLF may be a factor affecting the voltage change of the word line and may be expressed by ΔVWLF. In an embodiment, the word line factor WLF may be calculated by Equation 5 below by using parameters of the second transistor TR2 affecting a cell current.

$$WLF = \frac{1}{\left(\frac{VBLSHF}{2} - VTH_{TR2}\right)} \times \frac{1}{\sqrt{L_{TR2}}} \times \left(1 + \frac{L_{TR2}}{L'_{TR2}} \times \frac{1}{\left(1 + \frac{VBLSHF}{VBLSHF'}\right)}\right) \quad \text{[Equation 5]}$$

In Equation 5 above, $VTH_{TR2}$ may be a threshold voltage of the second transistor TR2; $L_{TR2}$ may be a channel length of the second transistor TR2; $L_{TR2}'$ may be an initial value of a channel length of the second transistor TR2; VBLSHF' may be an initial value of the bit line voltage VBLSSHF. For example, an amount of cell current and/or a potential of channel of a memory cell MC may affect a level of a word line voltage due to a capacitive coupling. Characteristics of the second transistor TR2 and the bit line voltage VBLSHF may affect the amount of cell current and/or the potential of the channel of the memory cell MC. The word line factor may represent effects to the word line voltage from the second transistor TR2 and the bit line voltage VBLSHF.

In operation S330, the electronic device 200 may output the reward. For example, the reward calculation module 320 of the semiconductor simulation module 300 executed by the processors 210 may provide the deep learning module 330 with the reward RW calculated based on Equation 1, Equation 4, and Equation 5 above.

Figure 11:
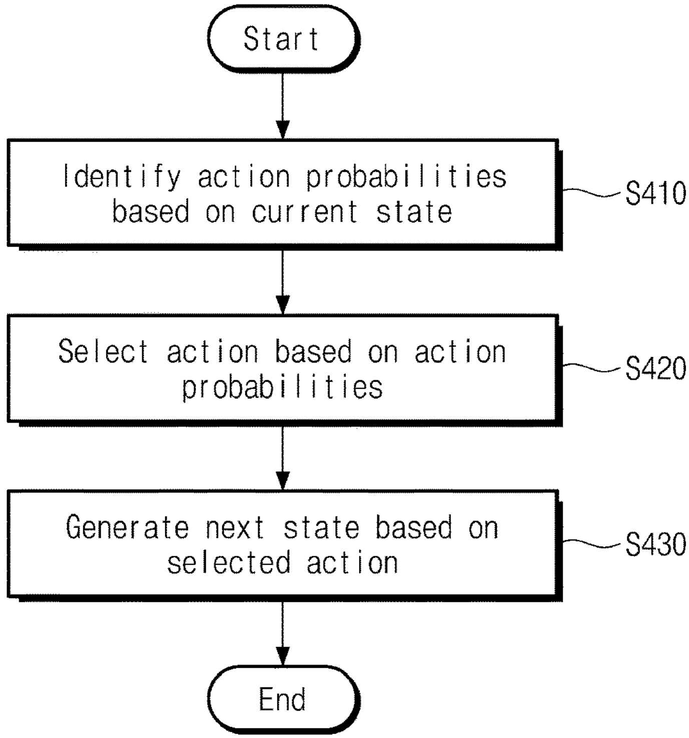
FIG. 11 illustrates an example of a process in which an electronic device performs an action.

FIG. 11 illustrates an example of a process in which the electronic device 200 performs an action. Referring to FIGS. 5 and 11, in operation S410, the electronic device 200 may identify action probabilities based on a current state. For example, the current state may correspond to current state parameters. The state parameters may include the first length information L_TR2, the second length information L_TR7, the third length information L_TR8, and the bit line voltage VBLSHF.

Actions may include direction information about how to adjust the state parameters. The action probabilities may include probabilities allocated to the actions of adjusting the state parameters. The current state may correspond to a plurality of actions and a plurality of action probabilities determined by the policy. The deep learning module 330 of the semiconductor simulation module 300 executed by the processors 210 may identify the plurality of actions and the plurality of action probabilities corresponding to the current state.

In operation S420, the electronic device 200 may select an action based on the action probabilities. For example, the deep learning module 330 of the semiconductor simulation module 300 executed by the processors 210 may select one of the actions based on the action probabilities. In operation S430, the electronic device 200 may generate a next state based on the selected action. For example, the deep learning module 330 of the semiconductor simulation module 300 executed by the processors 210 may generate state parameters of the next state based on the selected action.

Figure 12:
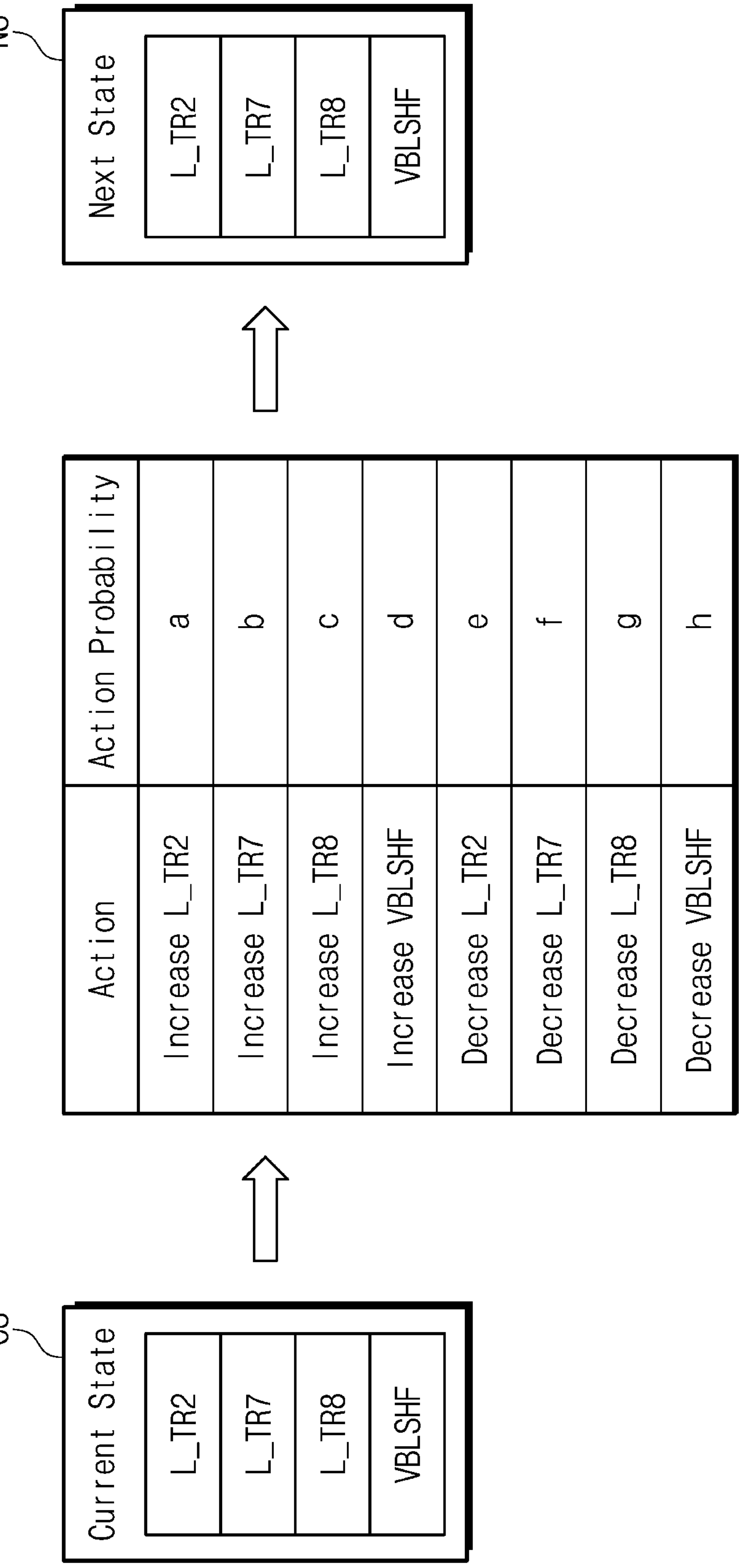
FIG. 12 illustrates an example in which a next state is generated based on actions and action probabilities corresponding to a current state.

FIG. 12 illustrates an example in which a next state is generated based on actions and action probabilities corresponding to a current state. Referring to FIGS. 5 and 12, a current state CS may include state parameters, and the state parameters may include the first length information L_TR2, the second length information L_TR7, the third length information L_TR8, and the bit line voltage VBLSHF.

A policy that is managed by the deep learning module 330 may manage actions and action probabilities corresponding to the state parameters of the current state CS. For example, an action probability of an action of increasing the first length information L_TR2 may be "a". An action probability of an action of increasing the second length information L_TR7 may be "b". An action probability of an action of increasing the third length information L_TR8 may be "c". An action probability of an action of increasing the bit line voltage VBLSHF may be "d".

An action probability of an action of decreasing the first length information L_TR2 may be "e". An action probability of an action of decreasing the second length information L_TR7 may be "f". An action probability of an action of decreasing the third length information L_TR8 may be "g". An action probability of an action of decreasing the bit line voltage VBLSHF may be "h".

A sum of the action probabilities "a", "b", "c", "d", "e", "f", "g", and "h" may be a normalized value such as "1" and "100". The deep learning module 330 may select one of the actions based on the action probabilities. The deep learning module 330 may generate state parameters of a next state NS based on the selected action. The state parameters may include the first length information L_TR2, the second length information L_TR7, the third length information L_TR8, and the bit line voltage VBLSSHF.

As described above, the deep learning module 330 may adjust one of state parameters based on an action probability to perform an episode. The action probabilities may be included in the policy, and the policy may be updated (or trained) in a direction of increasing a reward. For example, the action probabilities of the policy may be updated in a direction of increasing the reward obtained by each simulation. For example, because the action probabilities have the directionality of increasing the reward, the deep learning module 330 may select actions based on the action probabilities; when the episode is performed, a reward that is calculated by each action may increase. In some embodiments, parameters of the current simulation are set by the previous policy, and if the reward of the current simulation result turns out to be greater than the threshold value, the previous policy may be updated using the parameters of the current simulation, and parameters of the next simulation are set using the updated policy. As the policy is updated using the simulation results of which rewards are greater than the threshold value, the policy may be updated in a direction of increasing the reward.

Figure 13:
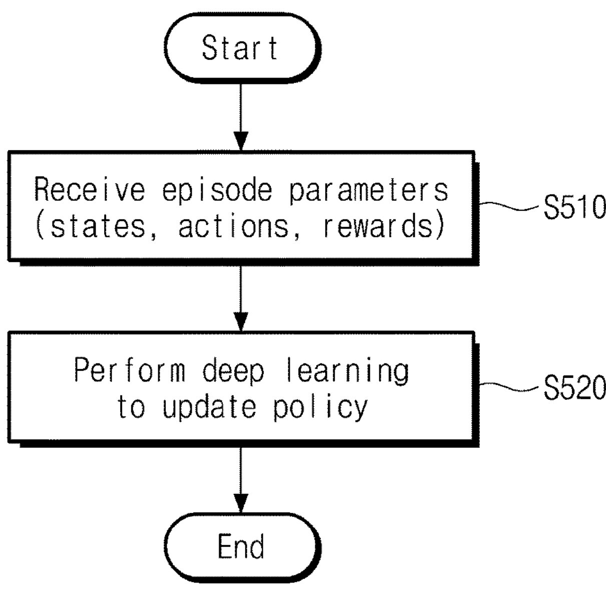
FIG. 13 illustrates an example in which an electronic device updates a policy.

FIG. 13 illustrates an example in which the electronic device 200 updates a policy. Referring to FIGS. 5 and 13, the electronic device 200 may receive episode parameters. For example, when one episode is completed, the deep learning module 330 of the semiconductor simulation module 300 executed by the processors 210 may receive the episode parameters including states of the completed episode (e.g., state parameters of each state generated in the episode), actions selected in the episode, and rewards generated by the actions.

In operation S520, the electronic device 200 may perform deep learning to update a policy. For example, the deep learning module 330 of the semiconductor simulation module 300 executed by the processors 210 may perform deep learning in a direction of increasing a reward, based on the episode parameters and may update the policy (e.g., action probabilities of the policy).

As described above, the deep learning module 330 may adjust one of state parameters based on an action probability to perform an episode. The action probabilities may be included in the policy, and the policy may be updated (or trained) in a direction of increasing a reward. For example, because the action probabilities have the directionality of increasing the reward, the deep learning module 330 may select actions based on the action probabilities; when the episode is performed, a reward that is calculated by each action may increase. When the deep learning module 330 performs episodes based on action probabilities, a reward that is selected by each episode may increase.

Figure 14:
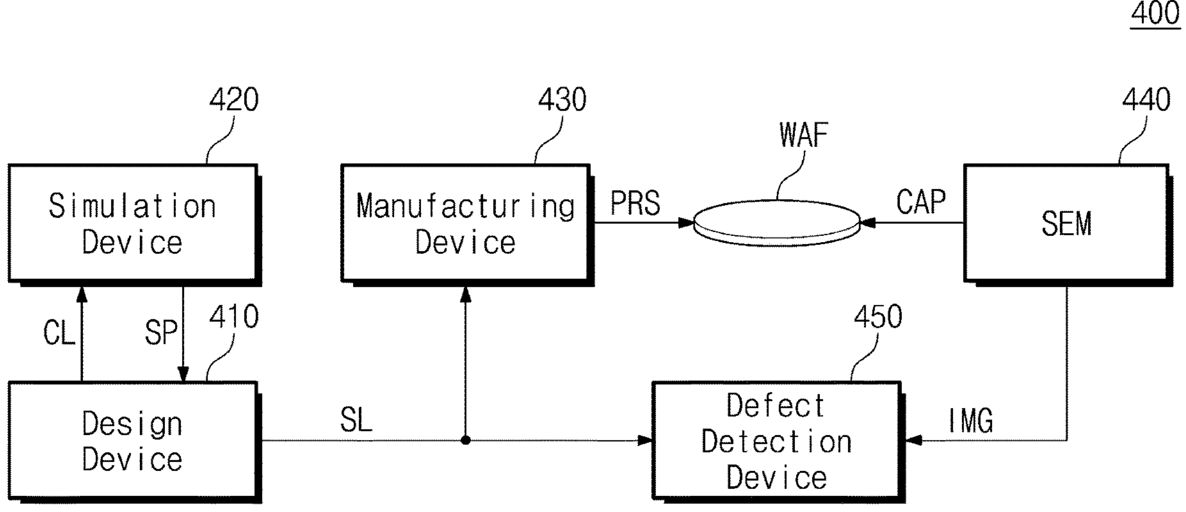
FIG. 14 illustrates a semiconductor manufacturing system according to an embodiment of the present disclosure.

FIG. 14 illustrates a semiconductor manufacturing system 400 according to an embodiment of the present disclosure. Referring to FIGS. 4 and 14, the semiconductor manufacturing system 400 may include a design device 410, a simulation device 420, a manufacturing device 430, a scanning electron microscope (SEM) 440, a defect detection device 450, and a wafer WAF.

The design device 410 may generate a circuit layout CL and a semiconductor layout SL. The circuit layout CL may include the components of the nonvolatile memory device 100 of the circuit level, which are illustrated in FIGS. 4 and 7. The semiconductor layout SL may include the components of the nonvolatile memory device 100 of a semiconductor pattern level.

The simulation device 420 may receive the circuit layout CL from the design device 410. Based on the circuit layout CL, the simulation device 420 may obtain a state parameter SP including the following of the page buffer PB: the length of the second transistor TR2, the length of the seventh transistor TR7, the length of the eighth transistor TR8, and the bit line voltage VBLSHF.

The design device 410 may generate the semiconductor layout SL based on the state parameter SP. Alternatively, the design device 410 may revise the semiconductor layout SL based on the state parameter SP.

The manufacturing device 430 may receive the semiconductor layout SL from the design device 410. The manufacturing device 430 may perform semiconductor manufacturing processes PRS with respect to the wafer WAF based on the semiconductor layout SL.

The SEM 440 may capture an image IMG of the wafer WAF to which the semiconductor manufacturing processes PRS are applied (refer to "CAP" in FIG. 14). The defect detection device 450 may detect a defect of the wafer WAF, to which the semiconductor manufacturing processes PRS are applied, based on the semiconductor layout SL and the image IMG.

The semiconductor manufacturing processes PRS may be applied by the manufacturing device 430, and the wafer WAF that is determined by the defect detection device 450 as being free from a defect or chips of the wafer WAF may be packaged through a packaging process as complete products of nonvolatile memory devices including the nonvolatile memory device 100.

In an embodiment, the simulation device 420 may correspond to the electronic device 200. The electronic device 200 may be implemented to perform the functions of the simulation device 420 and the design device 410. The electronic device 200 may be implemented to perform the functions of the simulation device 420 and the defect detection device 450. Alternatively, the electronic device 200 may be implemented to perform the functions of the simulation device 420, the design device 410, and the defect detection device 450.

In the above embodiments, components according to the present disclosure are described by using the terms "first", "second", "third", etc. However, the terms "first", "second", "third", etc. may be used to distinguish components from each other and do not limit the present disclosure. For example, the terms "first", "second", "third", etc. do not involve an order or a numerical meaning of any form.

In the above embodiments, components according to embodiments of the present disclosure are referenced by using blocks. The blocks may be implemented with various hardware devices, such as an integrated circuit, an application specific IC (ASIC), a field programmable gate array (FPGA), and a complex programmable logic device (CPLD), firmware driven in hardware devices, software such as an application, or a combination of a hardware device and software. The blocks may include circuits implemented with semiconductor elements in an integrated circuit, or circuits enrolled as an intellectual property (IP).

According to embodiments of the present disclosure, transistors and voltages of a page buffer of a flash memory are optimized. Accordingly, an electronic device supporting the manufacturing of the flash memory with an operating characteristic more robust against noise and an operating method of the electronic device are provided.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. An operating method of a circuit design system which includes a processor and a memory, the method comprising:

reading, at the processor, a circuit layout of a flash memory device including a page buffer from the memory;

initializing, at the processor, a value of a first parameter of at least one transistor of the page buffer and a value of a second parameter of at least one voltage applied to the page buffer;

performing, at the processor, circuit simulation on the page buffer using the initialized first and second parameters; and calculating, at the processor, a reward based on a result of the circuit simulation, wherein in response to the reward being not greater than a threshold value, the processor is configured to perform a subsequent action, and wherein the subsequent action includes:

adjust the value of the first parameter of the at least one transistor and the value of the second parameter of the at least one voltage; and perform subsequent circuit simulation on the page buffer using the adjusted first and second parameters.

2. The method of claim 1, further comprising:

storing a policy including probabilities of taking actions which are associated with the first and second parameters in the memory, wherein the adjusting of the value of the first parameter of the at least one transistor and the value of the second parameter of the at least one voltage is performed based on the probabilities of the policy.

3. The method of claim 2, wherein, in response to the reward being greater than the threshold value, updating, at the processor, the probabilities of the policy.

4. The method of claim 3, wherein the updating of the probabilities of the policy is performed using the value of the first parameter and the value of the second parameter.

5. The method of claim 1, further comprising:

repeating the subsequent action until one of a reward obtained from the circuit simulation of the subsequent action being greater than the threshold value and the number of repeating the subsequent action reaching a maximum number is satisfied.

6. The method of claim 1, wherein the page buffer includes:

a latch connected to a sensing node; and a first transistor connected between the sensing node and a bit line, and wherein the at least one transistor includes the first transistor.

7. The method of claim 1, wherein the page buffer includes:

a latch connected to a sensing node; and a first transistor connected between the sensing node and a bit line, and wherein the at least one voltage includes a voltage applied to a gate of the first transistor.

8. The method of claim 1, wherein the page buffer includes:

a latch connected to a sensing node; and a first transistor connected between the sensing node and a bit line, wherein the latch includes a first inverter and a second inverter that are cross-coupled with each other, and wherein the at least one transistor includes transistors of the first inverter and transistors of the second inverter.

9. The method of claim 1, wherein the flash memory device further includes;

a memory cell; and a bit line connected to the memory cell, wherein the page buffer includes:

a latch connected to a sensing node; and a transistor connected between the sensing node and the bit line, and wherein the performing of the circuit simulation includes:

detecting a trip voltage level of the sensing node, wherein a bit value of the latch is inverted at the trip voltage level;

measuring a first time point at which a voltage of the sensing node which is connected to the memory cell in an on-cell state is decreased from a precharge voltage level to the trip voltage level;

measuring a voltage difference between a voltage level of the sensing node which is connected to the memory cell in an off-cell state and the trip voltage level at the first time point; and measuring an amount of power consumption of the page buffer.

10. The method of claim 9, further comprising:

receiving, at the processor, at least one of the first time point, the voltage difference, and the amount of the power consumption as reward parameters, wherein the calculating of the reward includes:

calculating a weighted sum of the reward parameters.

11. The method of claim 10, wherein the first parameter is associated with a sum or an average of a first area of the at least one transistor, and wherein the calculating of the reward further includes:

multiplying the weighted sum with a ratio of the sum or the average of the first area to a sum or an average of a target area of the at least one transistor.

12. The method of claim 10, wherein the calculating of the reward further includes:

multiplying the weighted sum with a constant value representing a process variation of a process which is to be applied to fabricate the page buffer.

13. The method of claim 10, wherein the calculating of the reward further includes:

multiplying the weighted sum with a word line factor, and wherein the word line factor is determined based on the first and second parameters.

14. The method of claim 1, wherein in response to one of the reward obtained from the subsequent circuit simulation of the subsequent action being greater than the threshold value and the number of repeating the subsequent action reaching the maximum number being satisfied, performing, at the processor, a subsequent episode in which the circuit simulation of the page buffer is performed using the first and second parameters which are adjusted in a previous episode, and wherein the repeating of the subsequent episode is performed in a predetermined number of episodes.

15. An operating method of a circuit design system which includes a processor and a memory, the method comprising:

reading, at the processor, a circuit layout of a flash memory device including a page buffer from the memory; and performing, at the processor, a plurality of episodes on the circuit layout based on a policy, wherein each of the plurality of episodes includes:

performing, at the processor, circuit simulation on the circuit layout-circuit based on a value of a first parameter of at least one transistor of the page buffer and a value of a second parameter of at least one voltage applied to the page buffer;

calculating, at the processor, a reward based on reward parameters calculated based on a result of the circuit simulation; and performing a subsequent action on the circuit layout-circuit until a reward of the subsequent action is greater than a threshold value, and wherein the subsequent action includes:

adjusting the value of the first parameter of the at least one transistor and the value of the second parameter of the at least one voltage;

performing subsequent circuit simulation on the page buffer using the adjusted first and second parameters; and calculating the reward based on a result of the subsequent circuit simulation.

16. The method of claim 15, further comprising:

storing a policy including probabilities of taking actions which are associated with the first and second parameters in the memory, wherein each of the plurality of episodes further includes:

updating the probabilities of the policy based on adjustments of the first and second parameters, and a change in the reward of the subsequent action.

17. The method of claim 16, wherein the probabilities of the policy are associated with a direction of adjusting the first and second parameters.

18. The method of claim 16, further comprising:

updating, in response to a reward of a current action being greater than the threshold value, the probabilities of the policy in a direction that the reward of the subsequent action increases.

19. The method of claim 15, selecting, in response to the number of a plurality of episodes reaching a predetermined number, a parameter of the at least one transistor and a parameter of the at least one voltage, which correspond to a reward being the highest from among rewards calculated in the plurality of episodes.

20. A circuit design system comprising:

a memory configured to store a circuit layout of a flash memory device including a page buffer; and a processor configured to:

read the circuit layout from the memory, and perform a plurality of episodes on the circuit layout based on a policy, wherein the policy is updated in each episode of the plurality of episodes, and wherein, in each of the plurality of episodes, the processor is configured to:

perform circuit simulation on the page buffer based on a first parameter of at least one transistor of the page buffer and a second parameter of at least one voltage applied to the page buffer;

calculate a reward based on reward parameters calculated through the circuit simulation;

adjust values of the first and second parameters; and repeat the circuit simulation, the adjustment of the first and second parameters, and the calculation of the reward, until the reward is greater than a threshold value.

* * * * *